US012684758B2

(12) United States Patent
Kang et al.

(10) Patent No.: US 12,684,758 B2
(45) Date of Patent: Jul. 14, 2026

(54) 3-D DRAM STRUCTURES AND METHODS OF MANUFACTURE

(71) Applicant: Applied Materials, Inc., Santa Clara, CA (US)

(72) Inventors: Chang Seok Kang, Santa Clara, CA (US); Tomohiko Kitajima, San Jose, CA (US); Nitin K. Ingle, San Jose, CA (US); Sung-Kwan Kang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 258 days.

(21) Appl. No.: 18/096,923

(22) Filed: Jan. 13, 2023

(65) Prior Publication Data

US 2023/0157004 A1 May 18, 2023

Related U.S. Application Data

(63) Continuation of application No. 17/159,534, filed on Jan. 27, 2021, now Pat. No. 11,587,930.

(Continued)

(51) Int. Cl.
H10B 12/00 (2023.01)
H10D 30/01 (2025.01)
(Continued)

(52) U.S. Cl.
CPC ............. H10B 12/30 (2023.02); H10B 12/03 (2023.02); H10B 12/05 (2023.02); H10B 12/482 (2023.02);
(Continued)

(58) Field of Classification Search
CPC .............. H01L 27/1222; H01L 27/124; H01L 27/1255; H01L 27/127; H01L 29/42392;
(Continued)

(56) References Cited

U.S. PATENT DOCUMENTS

2004/0004257 A1* 1/2004 Lee ........................ H10D 1/692
257/E21.59
2013/0153851 A1 6/2013 Park
(Continued)

FOREIGN PATENT DOCUMENTS

JP 2019068067 A 4/2019
JP 2019096866 A 6/2019
(Continued)

OTHER PUBLICATIONS

PCT International Search Report and Written Opinion in PCT/US2021/015230 dated May 18, 2021, 12 pages.

*Primary Examiner* — Britt Hanley
*Assistant Examiner* — Kevin Quinto
(74) *Attorney, Agent, or Firm* — Servilla Whitney LLC

(57) ABSTRACT

Memory devices incorporating bridged word lines are described. The memory devices include a plurality of active regions spaced along a first direction, a second direction and a third direction. A plurality of conductive layers is arranged so that at least one conductive layer is adjacent to at least one side of each of the active regions along the third direction. A conductive bridge extends along the second direction to connect each of the conductive layers to one or more adjacent conductive layer. Some embodiments include an integrated etch stop layer. Methods of forming stacked memory devices are also described.

8 Claims, 30 Drawing Sheets

Related U.S. Application Data

(60) Provisional application No. 62/972,215, filed on Feb. 10, 2020.

(51) Int. Cl.

| | |
|---|---|
| *H10D 30/67* | (2025.01) |
| *H10D 86/01* | (2025.01) |
| *H10D 86/40* | (2025.01) |
| *H10D 86/60* | (2025.01) |

(52) U.S. Cl.
CPC ..... *H10D 30/0321* (2025.01); *H10D 30/6735* (2025.01); *H10D 30/6745* (2025.01); *H10D 86/0221* (2025.01); *H10D 86/421* (2025.01); *H10D 86/441* (2025.01); *H10D 86/481* (2025.01); *H10D 86/60* (2025.01)

(58) Field of Classification Search
CPC ........... H01L 29/6675; H01L 29/78648; H01L 29/78672; H10B 12/03; H10B 12/05; H10B 12/30; H10B 12/48; H10B 12/482; H10D 30/0321; H10D 30/6734; H10D 30/6735; H10D 30/6745; H10D 86/0221; H10D 86/421; H10D 86/441; H10D 86/481; H10D 86/60; H10D 30/673; H10D 64/518; H10D 64/519

See application file for complete search history.

(56) References Cited

U.S. PATENT DOCUMENTS

| | | | |
|---|---|---|---|
| 2018/0323199 A1 | 11/2018 | Roberts et al. | |
| 2019/0006376 A1 | 1/2019 | Vishak | |
| 2019/0074277 A1* | 3/2019 | Ramaswamy | G11C 11/221 |
| 2019/0103407 A1 | 4/2019 | Kim et al. | |
| 2019/0393267 A1 | 12/2019 | Pillarisetty et al. | |
| 2020/0279601 A1* | 9/2020 | Kim | G11C 11/4097 |

FOREIGN PATENT DOCUMENTS

| | | |
|---|---|---|
| JP | 2020141129 A | 9/2020 |
| KR | 20140052729 A | 5/2014 |
| TW | 201340294 A | 10/2013 |
| TW | 201521191 A | 6/2015 |
| TW | 201733023 A | 9/2017 |

* cited by examiner

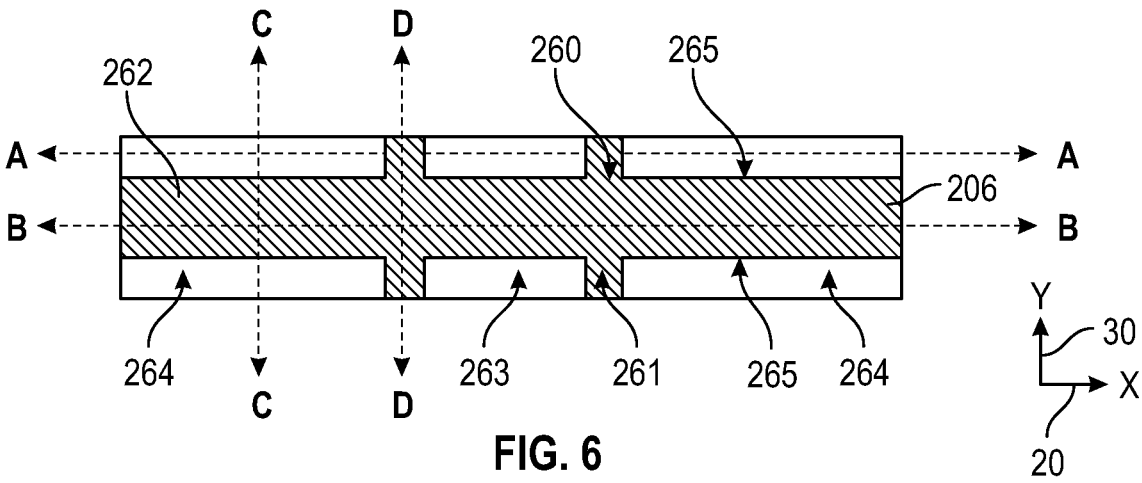
FIG. 6
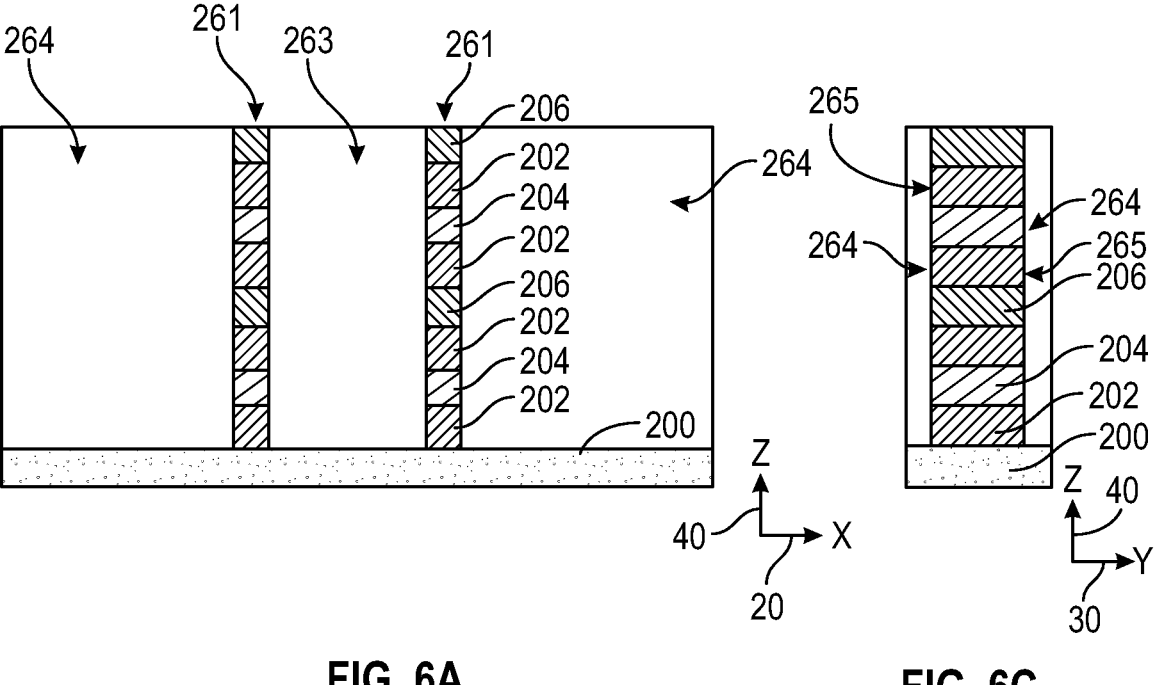
FIG. 6A                    FIG. 6C

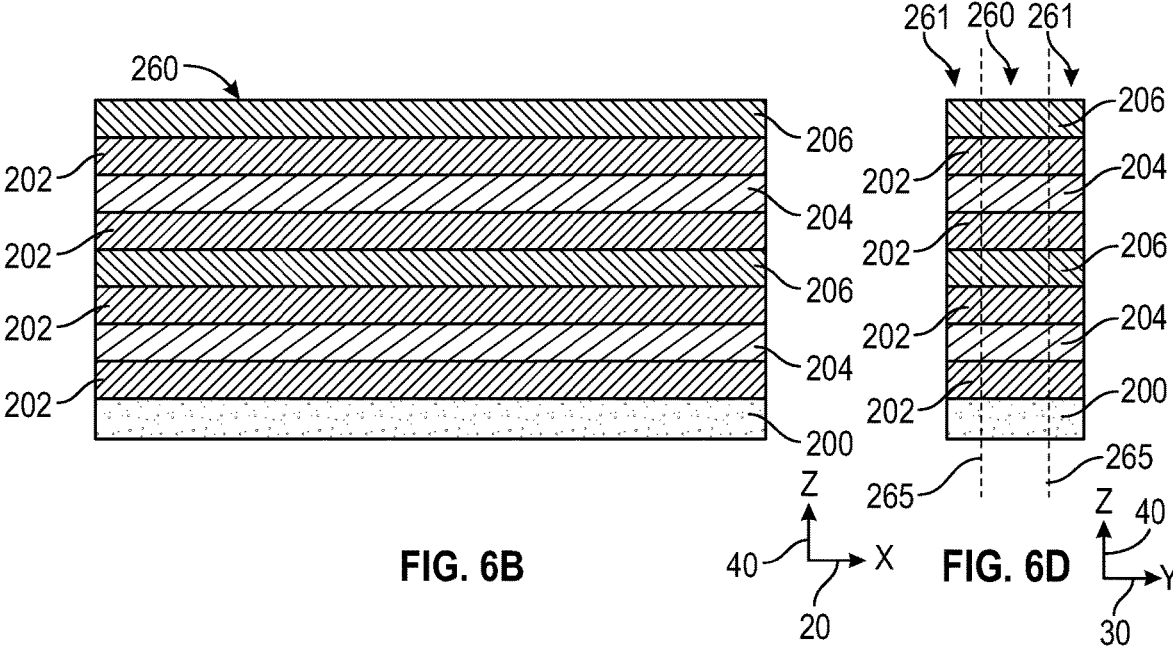
FIG. 6B
FIG. 6D
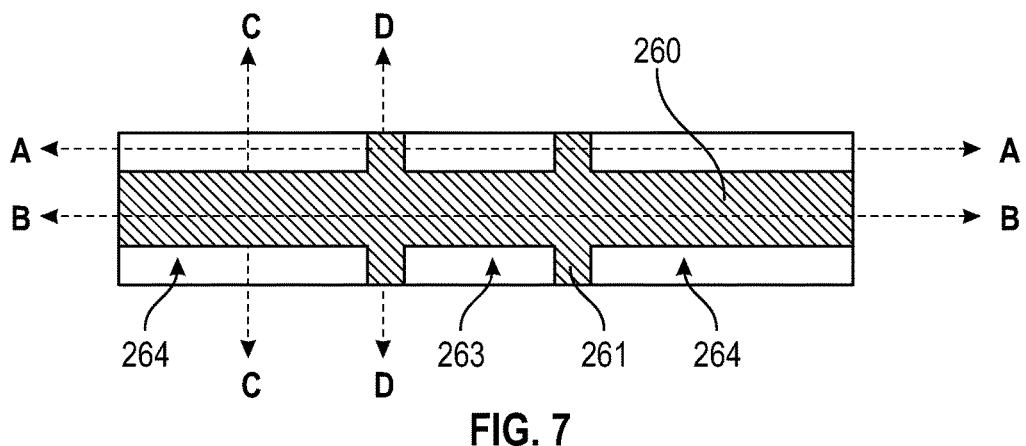
FIG. 7

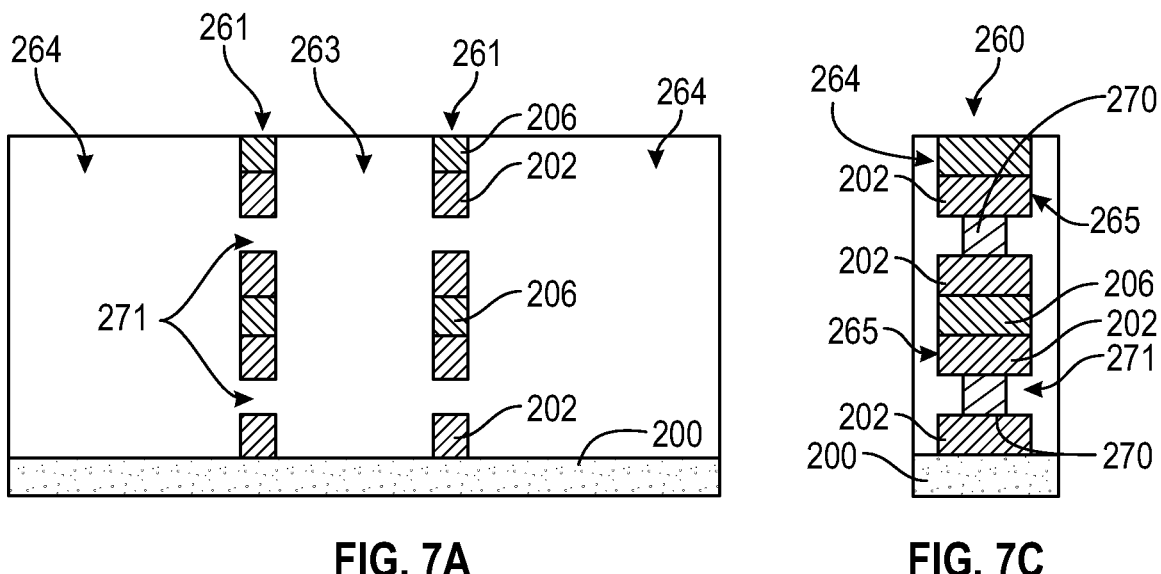
FIG. 7A                      FIG. 7C
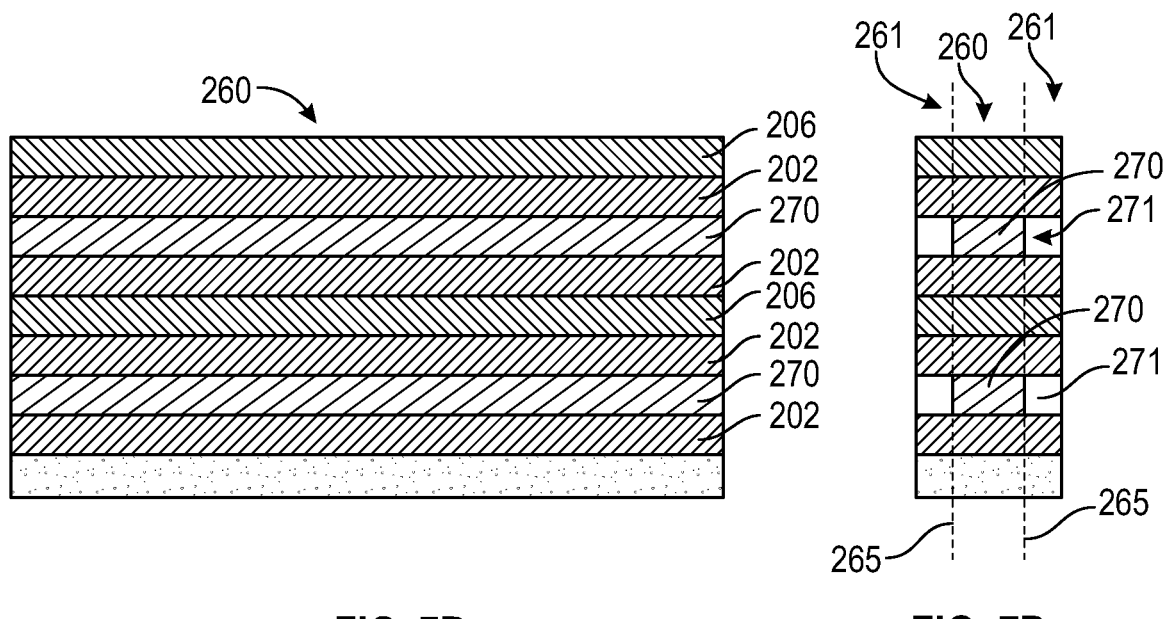
FIG. 7B                      FIG. 7D

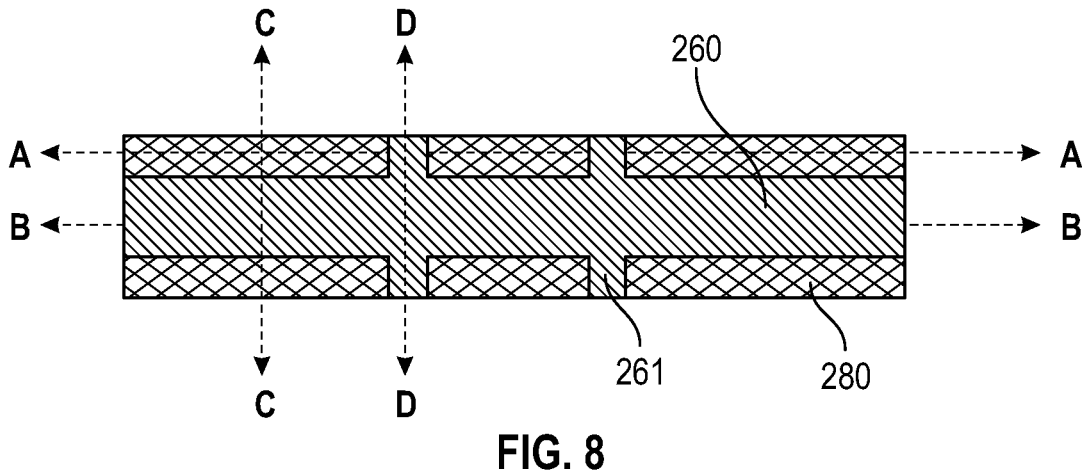
FIG. 8
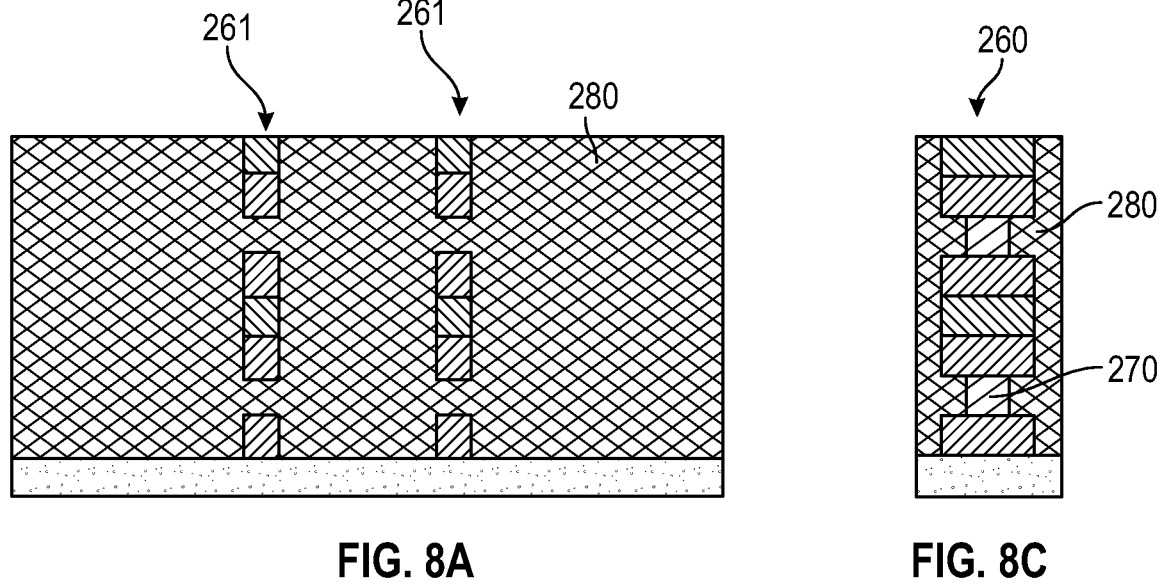
FIG. 8A　　　　　　　　　FIG. 8C

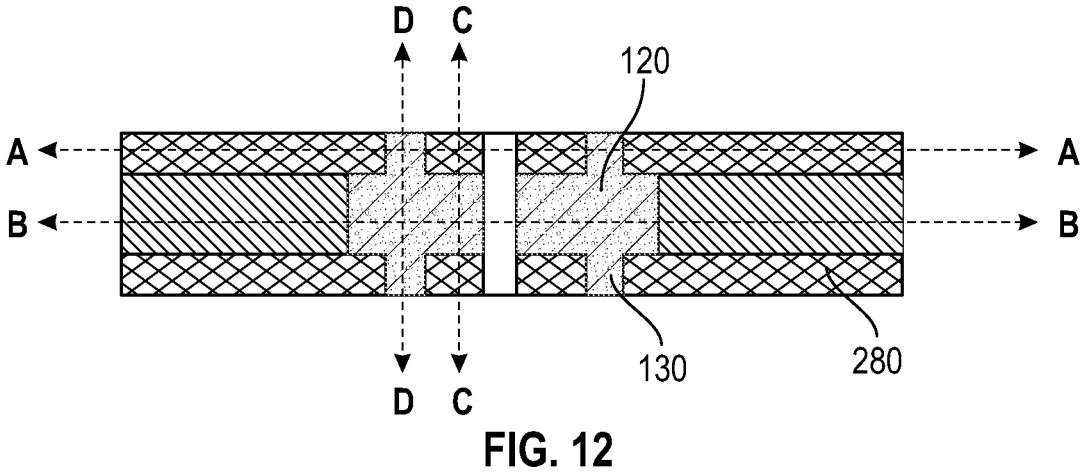
FIG. 12
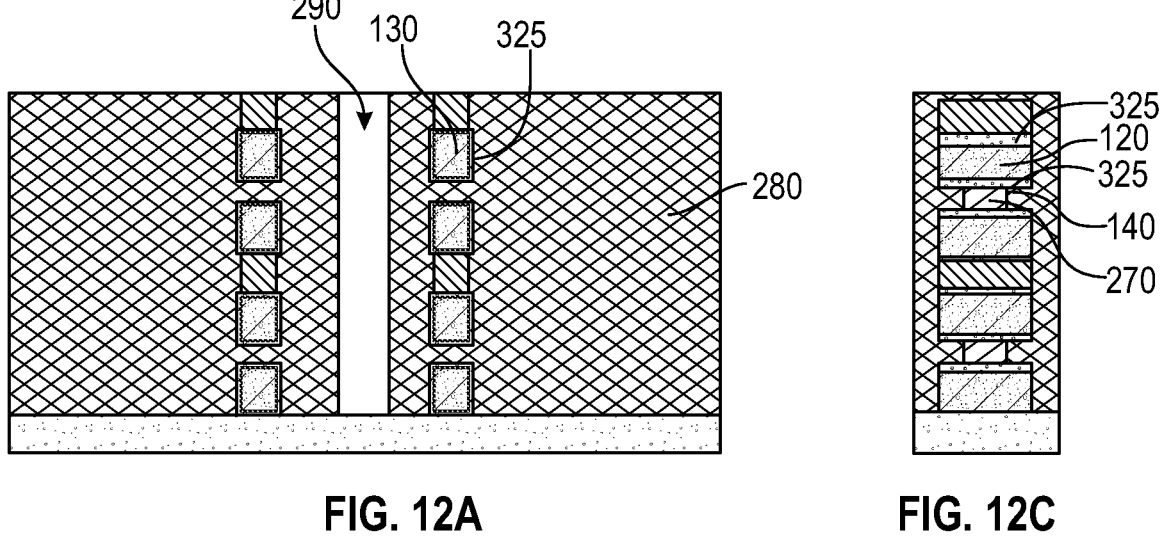
FIG. 12A        FIG. 12C

FIG. 12B          FIG. 12D

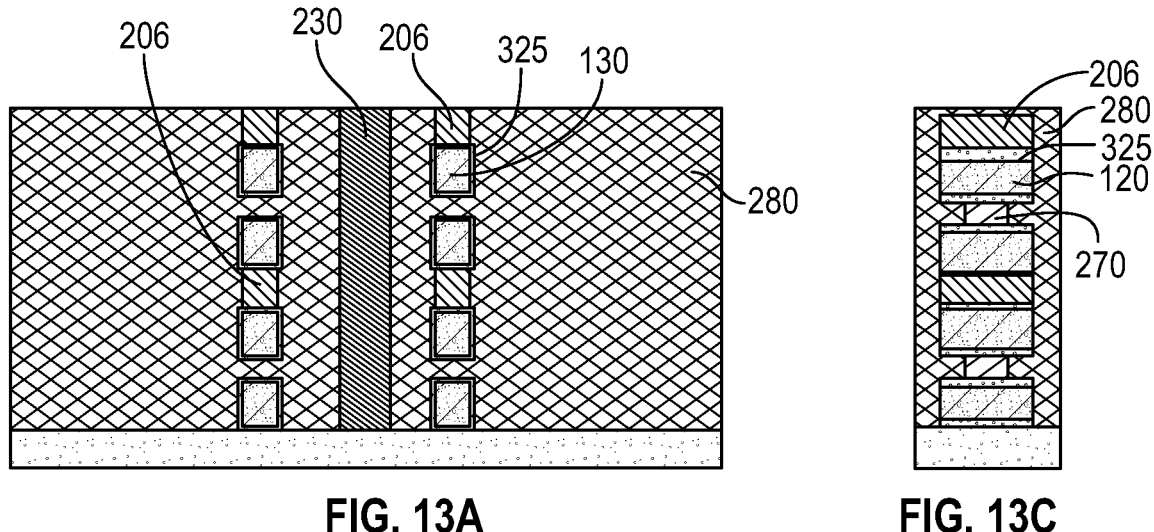
FIG. 13A
FIG. 13C
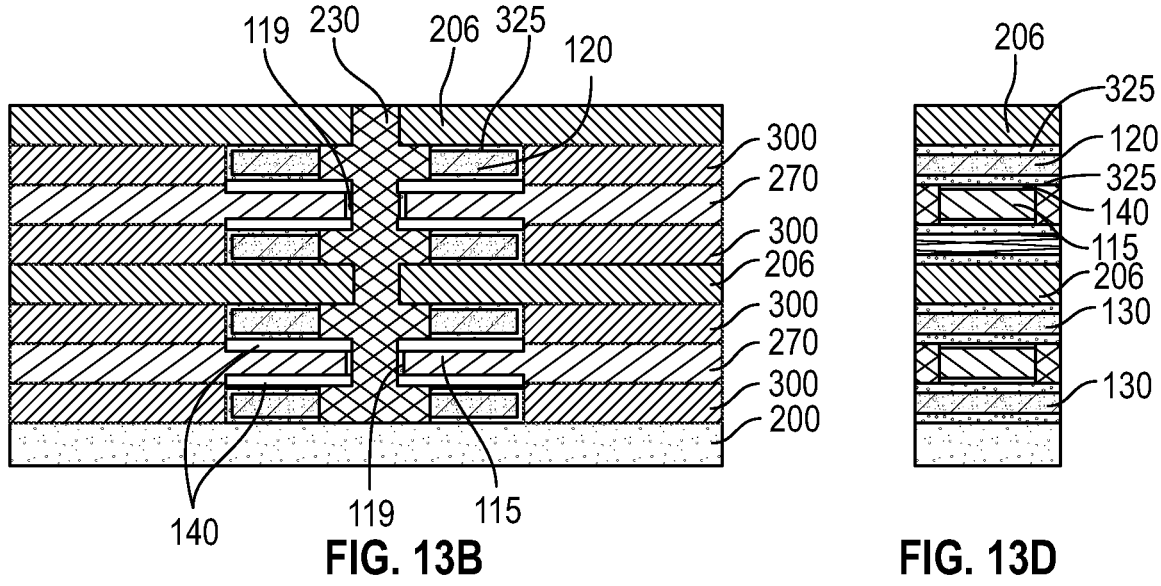
FIG. 13B
FIG. 13D

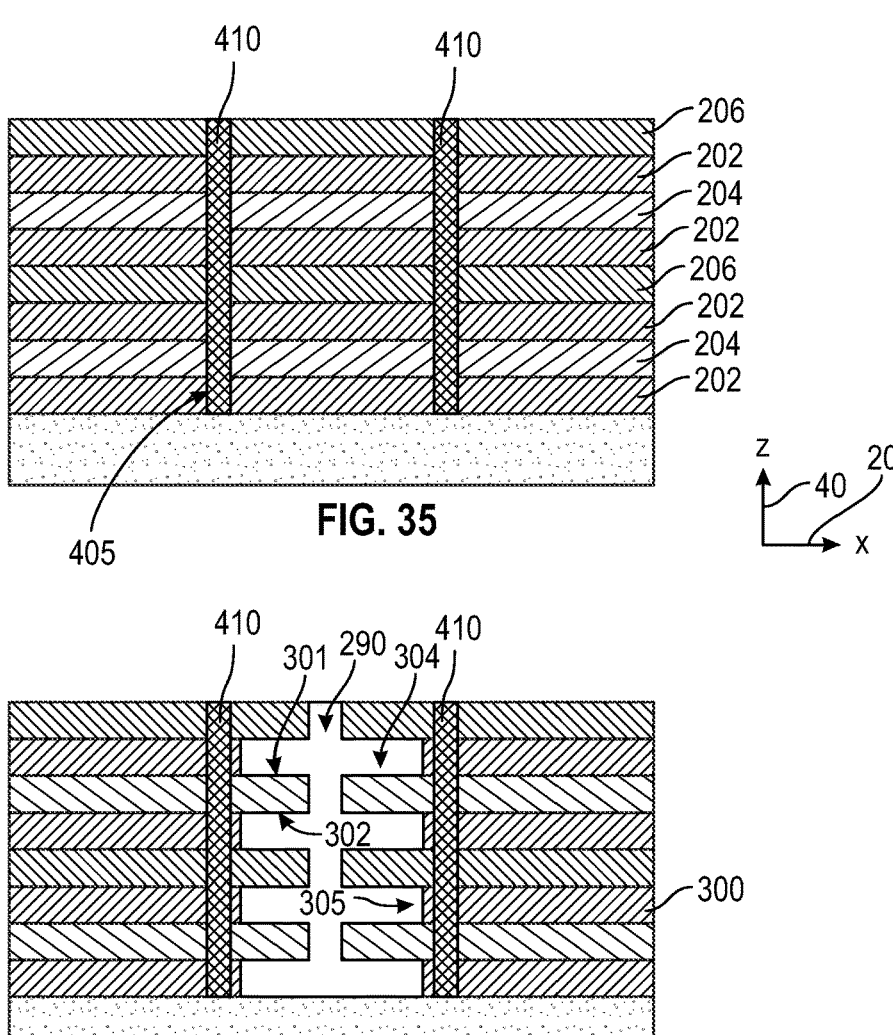
FIG. 35
FIG. 36
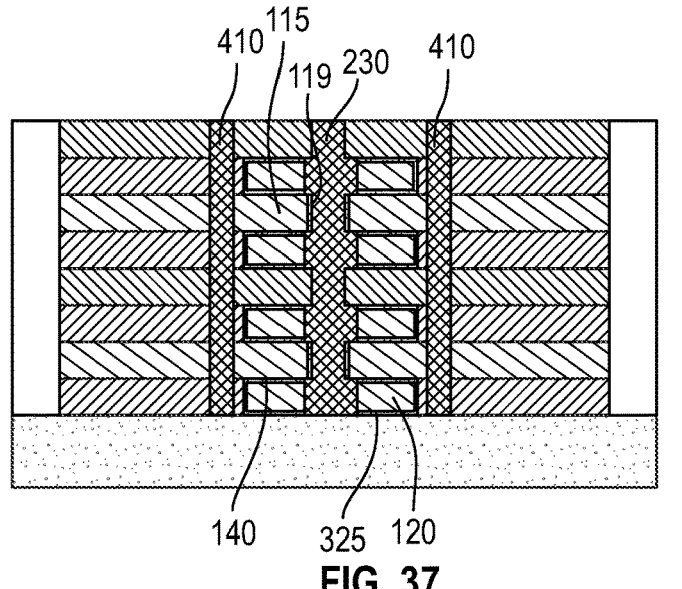
FIG. 37

3-D DRAM STRUCTURES AND METHODS OF MANUFACTURE

CROSS-REFERENCE TO RELATED APPLICATIONS

This application is a continuation of U.S. patent application Ser. No. 17/159,534, filed Jan. 27, 2021, which claims priority to U.S. Provisional Application No. 62/972,215, filed Feb. 10, 2020, the entire disclosures of which are hereby incorporated by reference herein.

TECHNICAL FIELD

Embodiments of the present disclosure pertain to the field of electronic devices and electronic device manufacturing. More particularly, embodiments of the disclosure provide dynamic random-access memory with bridged word lines and/or etch stop layers.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices In 3D memory devices word lines of the unit cell layers should be connected. However, the active layers of the unit cells should not be connected. Additionally, the lengths of the capacitors need to be controlled without the effects of variation during selective removal processes interfering. The length of the capacitor is longer than the gate length of the cell transistor. The longer selective removal length gives rise to larger variations in length due to variable removal rates. Therefore, there is a need in the art for memory devices and methods of forming memory devices that include one or more of connected word lines, separate active regions or etch controls.

SUMMARY

One or more embodiments of the disclosure are directed to memory devices comprising a plurality of active regions spaced along a first direction, a second direction and a third direction. A plurality of conductive layers is arranged so that at least one conductive layer is adjacent to at least one side of each of the active along the third direction. A conductive bridge extends along the second direction and connects each conductive layer to one or more adjacent conductive layer.

Additional embodiments of the disclosure are directed to memory devices comprising a plurality of pairs of active regions spaced along a first direction, a second direction and a third direction. A plurality of bit lines extend along the third direction between the pairs of active regions spaced in the first direction. A plurality of conductive layers is arranged so that at least one conductive layer is adjacent to at least one side of each of the active regions. The at least one side being located along the third direction relative to the active region. A conductive bridge extends along the second direction connecting each conductive layer to one or more adjacent conductive layer.

Further embodiments of the disclosure are directed to methods of forming a memory device. A stack of films comprising a sacrificial layer and a channel layer is patterned to form a pair of pre-bridge stacks separated along a first direction and an isolated film stack extending along the first direction. The pre-bridge stacks are formed on either side of the isolated film stack, along a second direction, creating an opening between the pre-bridge stacks and openings outside the pre-bridge stacks, along the first direction, and a gap between the isolated film stack and an adjacent film stack along the second direction. The channel layer is removed from the pre-bridge stacks and is recessed into the isolated film stack through the openings to form recessed channel layers in the isolated film stack. The openings and recessed channel layers are filled with a dielectric. A trench is formed in the isolated film stack along the second direction. The trench is formed between the pair of pre-bridge stacks along the first direction. A portion of the sacrificial layer is removed from the isolated film stack through the trench to form a recessed sacrificial layer with a recessed sacrificial layer surface and a word line opening, and expose a surface of the channel layer. A gate oxide layer is formed in the word line opening on the surface of the channel layer exposed through the trench. A conductive layer is deposited in the word line opening on the gate oxide layer. The trench is filled with a dielectric. A slit pattern is formed through the sacrificial layer and channel layer. The slit pattern is formed on opposite sides of the location that the trench was formed and outside of the conductive layer in the word line opening. The slit pattern exposes a sidewall of the channel layer and a sidewall of the sacrificial layer. A portion of channel layer is removed through the slit pattern to form a capacitor opening exposing a face of the sacrificial layer and recessed channel layer. A capacitor is formed in the capacitor opening adjacent the recessed channel layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 6 illustrate a schematic top view of a memory device after isolation patterning according to one or more embodiments;

FIG. 6A illustrates a cross-sectional slice of a memory device taken along line A-A of FIG. 6;

FIG. 6B illustrates a cross-sectional slice of a memory device taken along line B-B of FIG. 6;

FIG. 6C illustrates a cross-sectional slice of a memory device taken along line C-C of FIG. 6;

FIG. 6D illustrates a cross-sectional slice of the memory device taken along line D-D of FIG. 6;

FIG. 7 illustrate a schematic top view of a memory device after active isolation according to one or more embodiments;

FIG. 7A illustrates a cross-sectional slice of a memory device taken along line A-A of FIG. 7;

FIG. 7B illustrates a cross-sectional slice of a memory device taken along line B-B of FIG. 7;

FIG. 7C illustrates a cross-sectional slice of a memory device taken along line C-C of FIG. 7;

FIG. 7D illustrates a cross-sectional slice of the memory device taken along line D-D of FIG. 7;

FIG. 8 illustrate a schematic top view of a memory device after a dielectric fill according to one or more embodiments;

FIG. 8A illustrates a cross-sectional slice of a memory device taken along line A-A of FIG. 8;

FIG. 8B illustrates a cross-sectional slice of a memory device taken along line B-B of FIG. 8;

FIG. 8C illustrates a cross-sectional slice of a memory device taken along line C-C of FIG. 8;

FIG. 8D illustrates a cross-sectional slice of the memory device taken along line D-D of FIG. 8;

FIG. 10B illustrates a cross-sectional slice of a memory device taken along line B-B of FIG. 10;

FIG. 10D illustrates a cross-sectional slice of the memory device taken along line D-D of FIG. 10;

FIG. 12 illustrate a schematic top view of a memory device after word line formation according to one or more embodiments;

FIG. 12A illustrates a cross-sectional slice of a memory device taken along line A-A of FIG. 12;

FIG. 12B illustrates a cross-sectional slice of a memory device taken along line B-B of FIG. 12;

FIG. 12C illustrates a cross-sectional slice of a memory device taken along line C-C of FIG. 12;

FIG. 12D illustrates a cross-sectional slice of the memory device taken along line D-D of FIG. 12;

FIG. 13A illustrates a cross-sectional slice of a memory device taken along line A-A of FIG. 13;

FIG. 13B illustrates a cross-sectional slice of a memory device taken along line B-B of FIG. 13;

FIG. 13C illustrates a cross-sectional slice of a memory device taken along line C-C of FIG. 13;

FIG. 13D illustrates a cross-sectional slice of the memory device taken along line D-D of FIG. 13;

FIG. 35 illustrates a cross-sectional view of a film stack with etch layers according to one or more embodiments;

FIG. 36 illustrates a cross-sectional view of the memory device of FIG. 35 after recessing the sacrificial layers according to one or more embodiments;

FIG. 37 illustrates a cross-sectional view of the memory device of FIG. 36 after multiple processes to form the word lines and active region and slit patterning according to one or more embodiments;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In the buried word line (bWL), a word line is buried below the surface of a semiconductor substrate using a metal as a gate electrode.

In one or more embodiments, memory devices are provided which have stacked DRAM cells, resulting in an increase in DRAM cell bit-density, which is proportional to the number of multi-pair films. The DRAM device of one or more embodiments has vertical bit lines, minimizing bit line capacitance and reducing the burden of capacitor capacitance.

Some embodiments advantageously provide memory devices and methods of forming memory devices with increased device density. Some embodiments provide devices where the active region of each unit cell is separated horizontally by insulators between each active region. Some embodiments provide word lines for each cell at the same row and the same stack level connected through a bridge. In some embodiments, the bridge is smaller than the width of the gate. In some embodiments, one side of the active is connected with a capacitor and the other side is connected with a bit line.

Some embodiments provide memory devices and methods of forming memory devices with improved integration to fabricate 3D DRAM. In some embodiments, the length of the capacitors is controlled to eliminate or minimized variations due to selective removal processes of the sacrificial layers. In some embodiments, the length of the capacitor is longer than the gate length of the cell transistor.

Figure 1:
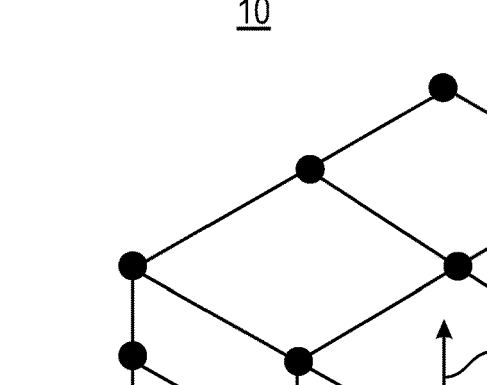
FIG. 1 illustrates a schematic parallel projection view of a memory device according illustrating the coordinate naming according to one or more embodiment of the disclosure.
Figure 1:
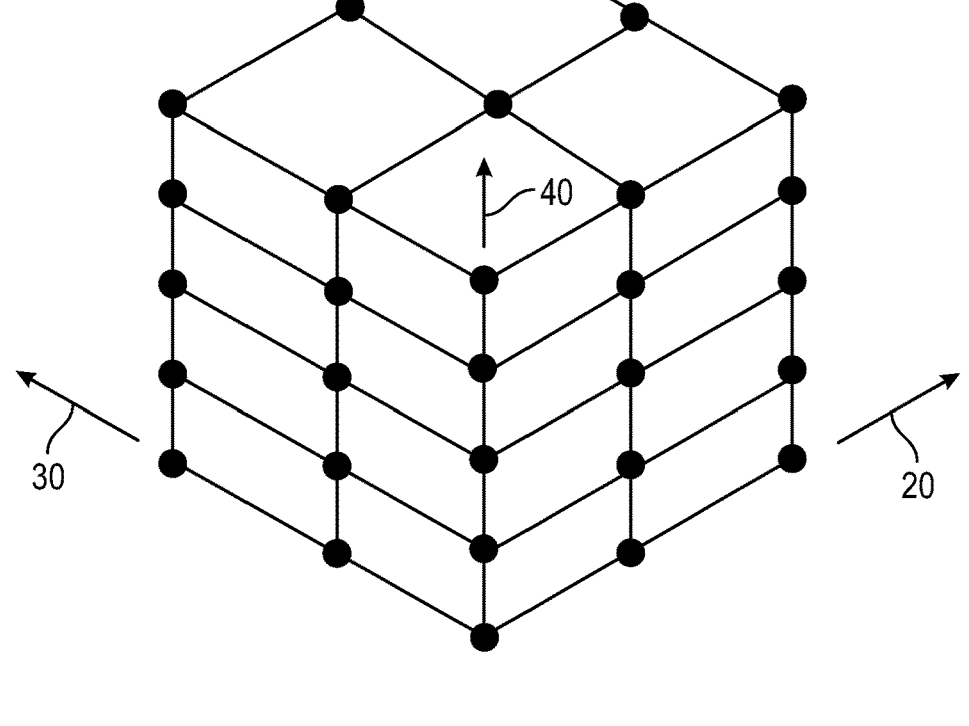
Figure 1:
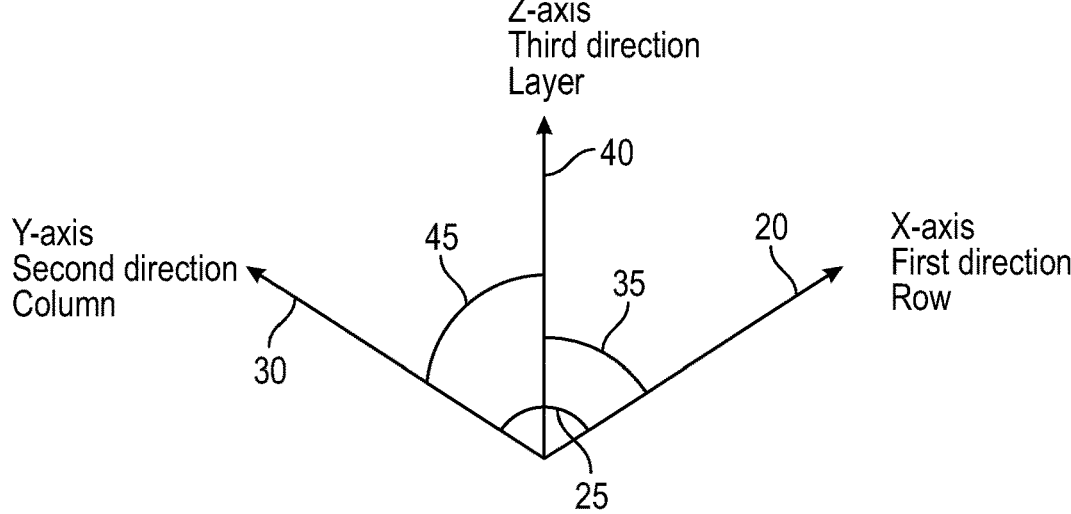

FIG. 1 illustrates a generic three-dimensional structure of a 3D DRAM device 10 in accordance with one or more embodiment of the disclosure. The device 10 has a three-dimensional array of active regions arranged into rows, columns and layers. The conventions used herein, the rows are referred to as the X-axis or first direction 20; the columns are referred to as the Y-axis or second direction 30, and the layers are referred to as the Z-axis or third direction 40. The angle 25 between the first direction 20 and second direction 30 is any suitable angle in the range of 30° to 150°, or in the range of 45° to 135°, or in the range of 60° to 120°, or in the range of 75° to 105°, or in the range of 85° to 95°. The angle 35 between the first direction 20 and the third direction 30 is any suitable angle in the range of 30° to 150°, or in the range of 45° to 135°, or in the range of 60° to 120°, or in the range of 75° to 105°, or in the range of 85° to 95°. The angle 45 between the second direction 30 and the third direction 40 is any suitable angle in the range of 30° to 150°, or in the range of 45° to 135°, or in the range of 60° to 120°, or in the range of 75° to 105°, or in the range of 85° to 95°. In some embodiments, each of angles 25, 35 and 45 are in the range of 85° to 95°.

Figure 2A:
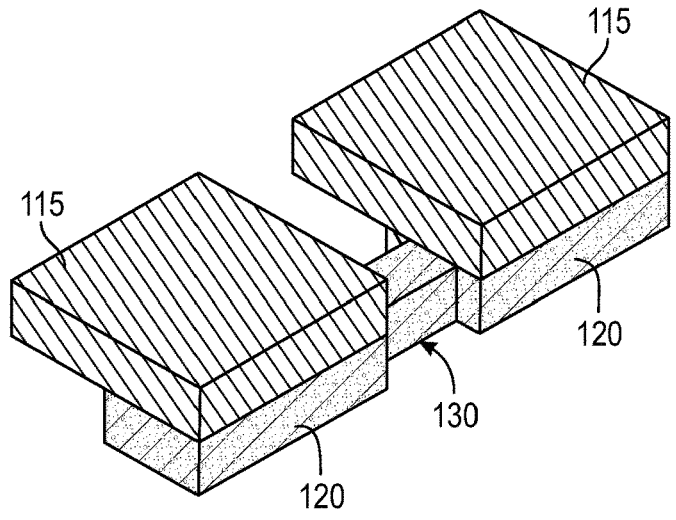
FIG. 2A through 2C illustrate isometric views of a memory device with one or two word lines adjacent the active region according to one or more embodiment of the disclosure.
Figure 2B:
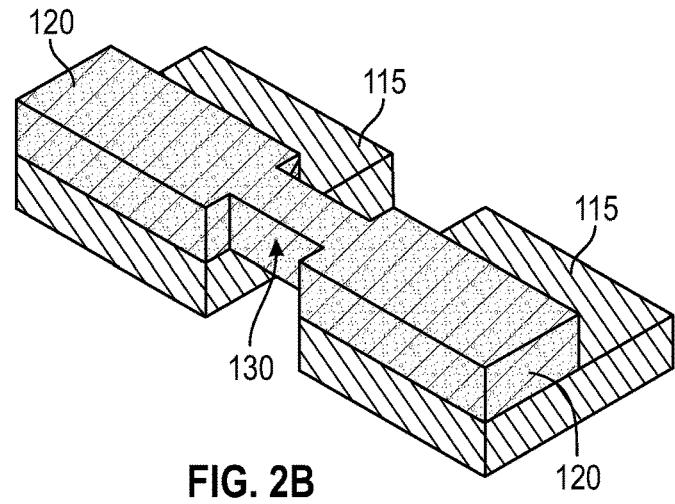
Figure 2C:
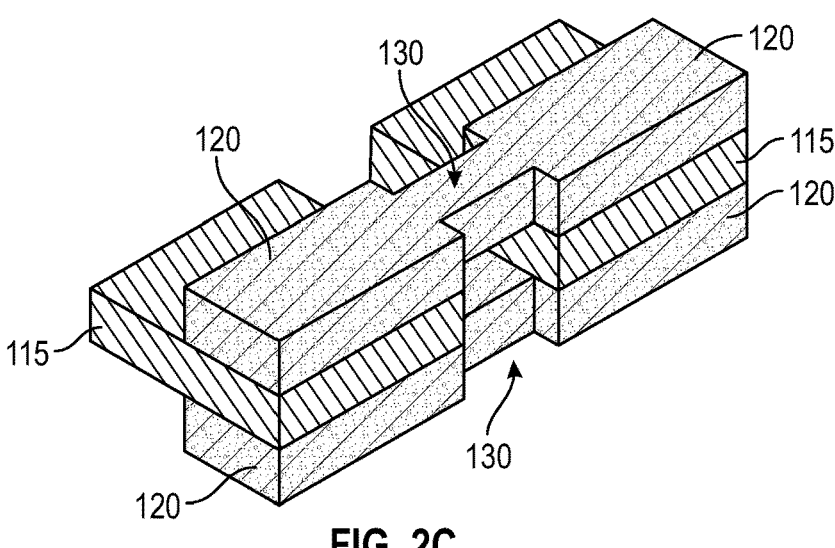
Figure 20:
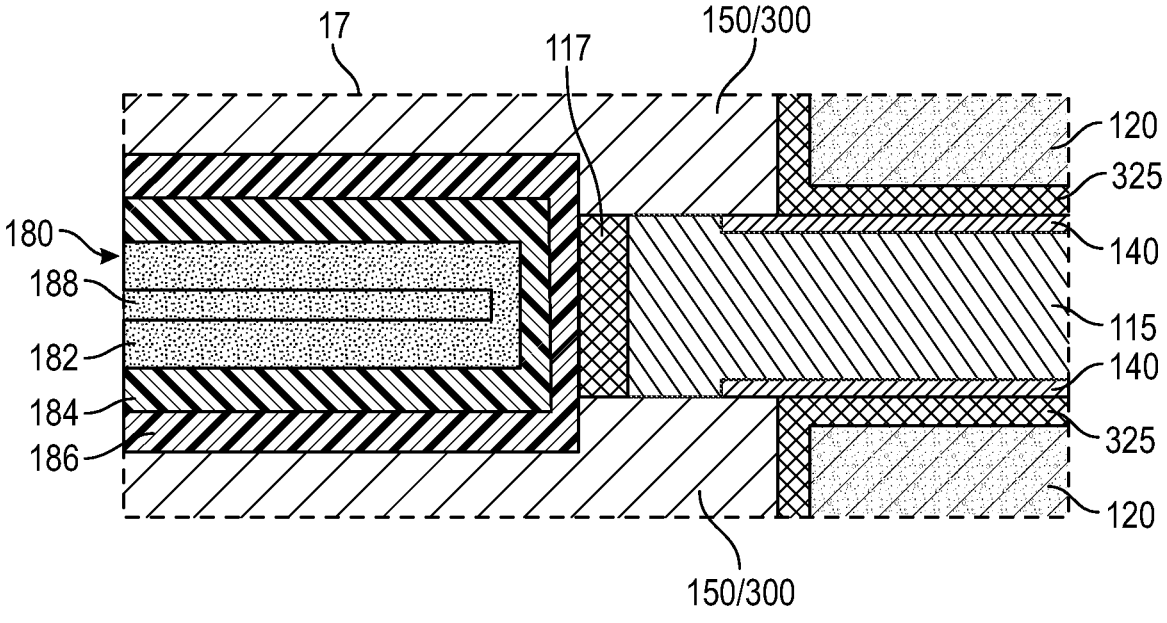
FIG. 20 illustrates an expanded cross-sectional view of a memory device after forming a capacitor in the expanded opening according to one or more embodiments.

FIGS. 2A through 2C illustrated three arrangements of active regions 115, conductive layers 120 and bridges 130 connecting adjacent conductive layers 120. In FIG. 2A, the conductive layers 120 and bridge 130 are on the bottom of the active regions 115. As used in this specification, the terms "top", "bottom", "above", "below", and the like, refer to a physical orientation along the Z-axis or third direction 40 and should not be taken as limiting the scope of the disclosure to any particular orientation related to the normal pull of gravity. In FIG. 2B, the conductive layers 120 and bridge 130 are on the top of the active regions 115. In FIG. 20, the conductive layers 120 and bridges 130 are both above and below the active region 115.

Figure 3:
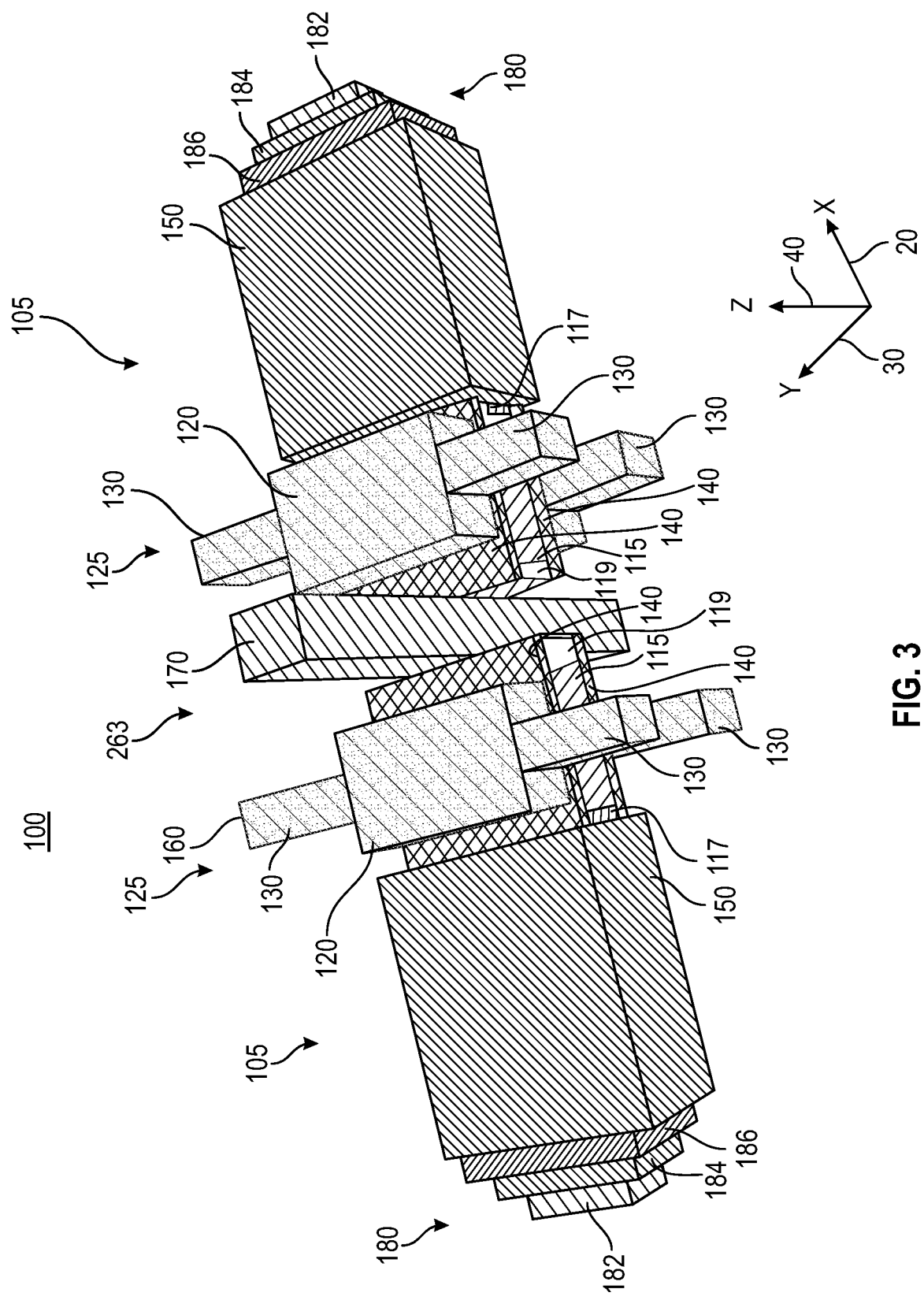
FIG. 3 illustrates a parallel projection view of a memory device according to one or more embodiment of the disclosure.
Figure 4:
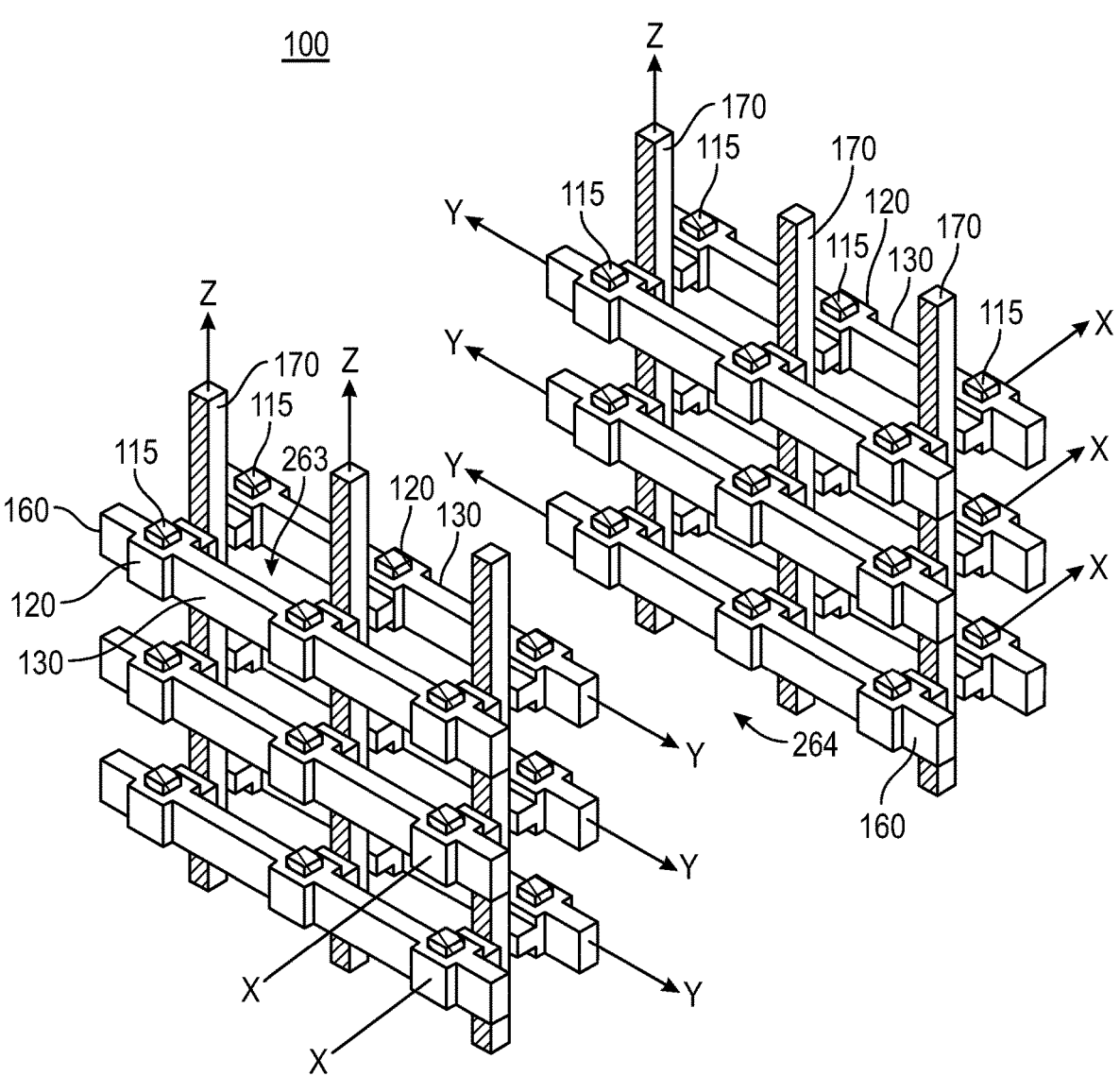
FIG. 4 illustrates an isometric view of a section of a memory device according to one or more embodiment of the disclosure.

FIG. 3 illustrates a parallel projection view of a memory device 100 in accordance with one or more embodiment of the disclosure. FIG. 4 illustrates an isometric schematic view of a 3D memory device 100. The device 100 illustrated has a total of six bit lines 170 and twelve word lines 125. A total thirty-six active regions 115 are connected with conductive layers 120 and bridges 130. The embodiment shown in FIG. 3 shows two unit cells 105 on either side of, and each unit cell 105 including a portion of, a bit line 170. Each of the unit cells 105 of some embodiments independently store data.

Referring to FIGS. 3 and 4, the memory device 100 of some embodiments comprises a plurality of active regions 115 spaced along a first direction 20 (as shown in FIGS. 3 and 4), a second direction 30 (as shown in FIG. 4) and a third direction 40 (as shown in FIG. 4). The active region 115 of some embodiments comprises a transistor. The active region 115 of some embodiments comprises a stack of material layers (not shown) including a charge tunneling layer, a charge trapping layer and a charge blocking layer. The skilled artisan will understand the process for forming a transistor, and for purposes of drawing clarity, the individual layers are not illustrated.

A plurality of conductive layers 120 are arranged so that at least one conductive layer 120 is adjacent to at least one side of each of the active regions 115 along the third direction 40. As used in this manner, the term "adjacent to" means next to, in direct contact with or with a minimal number of components or distance between the stated components. For example, the conductive layer 120 illustrated in FIG. 3 is adjacent to the active region 115 with a gate oxide layer 140 between.

In some embodiments, at least some of the active regions 115 have one conductive layer 120 adjacent thereto, as illustrated in FIGS. 2A, 2B and 4. In some embodiments, each of the active regions 115 has a conductive layer 120 on either side of the active region 115, along the third direction, as shown in FIGS. 2C and 3. As used in this manner, the arrangement of components along a specified direction means that the stated components are aligned along that direction. For example, the conductive layers 120 on either side of the active region 115, as shown in FIG. 3, means that the conductive layers 120 are aligned along the third direction 40 (the Z-axis direction) with the active region 115.

A conductive bridge 130 extends along the second direction 20. The conductive bridge 130 connects the conductive layer 120 to one or more adjacent conductive layers. The conductive bridges 130 shown in FIG. 4 illustrate the connections to multiple adjacent conductive layers 120. The conductive bridges 130 form a connection between the conductive layers 120 along the second direction 20, the Y-axis direction.

In some embodiments, as shown in FIG. 3, a gate oxide layer 140 is positioned between the active region 115 and the conductive layer 120. The gate oxide 140 can be any suitable dielectric material including low-k and high-k dielectric materials. In some embodiments, the gate oxide layer 140 comprises one or more of silicon oxide, silicon nitride or silicon oxynitride.

The memory device 100 of some embodiments includes a capacitor 180 on a side of the active region 115 along the first direction 20. The capacitor 180 is electrically separated from the conductive layers 120 and the conductive bridges 130. Stated differently, the capacitor 180 is not in direct contact with the conductive layers 120 or the conductive bridge 130.

The capacitor 180 of some embodiments comprises a lower electrode 182, a high-k dielectric 184 and an upper electrode 186. The lower electrode 182 is in contact with the active region 115. The high-k dielectric 184 is adjacent to the lower electrode 182 and on an opposite side of the lower electrode 182 than the active region 115. The upper electrode 186 is adjacent to the high-k dielectric 184 and on an opposite side from the lower electrode 182. In some embodiments, the high-k dielectric 184 directly contacts the lower electrode 182. In some embodiments, the upper electrode 186 directly contacts the high-k dielectric 184.

In some embodiments, a doped layer 117 is between the active region 115 and the lower electrode 182 along the first direction 20. The doped layer 117 can be any suitable material known to the skilled artisan. In some embodiments, the doped layer 117 comprises titanium nitride.

In some embodiments, the active region 115 includes a source/drain region 119 adjacent to the bit line 170. The source/drain region 119 can be formed by any suitable technique known to the skilled artisan.

The memory device 100 of some embodiments further comprises a bit line 170 extending along the third direction 40. The bit line 170 is adjacent to the active regions 115 that are spaced along the third direction 40 (as shown in FIG. 4). The bit line 170 of some embodiments is in direct contact with the active region 115. In some embodiments, the bit line 170 is spaced from the active region 115 by a conductive material.

For uniformity of measurements and size relationships, the length of any given component is measured along the first direction 20 (the X-axis direction), the width is measured along the second direction 30 (the Y-axis direction) and the height is measured along the third direction 40 (the Z-axis direction).

In some embodiments, the length of the active region 115 along the first direction 20 is in the range of 50 nm to 300 nm, or in the range of about 75 nm to about 200 nm, or in the range of about 100 nm to about 150 nm, or in the range of about 110 nm to about 130 nm. In some embodiments, a source/drain region 119 is located at the end of the active region 115 adjacent the bit line 170, and the source/drain region 119 is included in the overall length of the active region 115. In some embodiments, a doped layer 117 is located at the end of the active region 115 adjacent the capacitor 180 and the doped layer 117 is included in the overall length of the active region. In some embodiments, both a doped layer 117 and a source/drain region 119 are included in the active region 115 length.

In some embodiments, the width of the active region 115 along the second direction 30 is in the range of 50 nm to 300 nm, or in the range of about 75 nm to about 200 nm, or in the range of about 100 nm to about 150 nm, or in the range of about 110 nm to about 130 nm.

In some embodiments, the length of the capacitor 180 along the first direction 20 is in the range of 200 nm to 1500 nm, or in the range of about 300 nm to about 1000 nm, or in the range of about 400 nm to about 750 nm, or in the range of about 450 nm to about 550 nm. In some embodiments, the width of the capacitor 180 along the second direction 30 is in the range of 50 nm to 300 nm, or in the range of about 75 nm to about 200 nm, or in the range of about 100 nm to about 150 nm, or in the range of about 110 nm to about 130 nm.

In some embodiments, the length of the conductive layer 120 along the first direction 20 is in the range of 50 nm to 200 nm, or in the range of 75 nm to 150 nm, or in the range of 90 nm to 125 nm. In some embodiments, the width of the conductive layer 120 along the second direction 30 is in the range of 40 nm to 250 nm, or in the range of 50 nm to 200 nm, or in the range of 75 nm to 150 nm, or in the range of 90 nm to 125 nm.

In some embodiments, the conductive layer 120 is spaced along the first direction 20 from the bit line 170. In one or more embodiments, the space between the conductive layer 120 and the bit line 170 along the first direction 20 is in the range of 5 nm to 20 nm, or in the range of 8 nm to 15 nm, or about 10 nm. In some embodiments, the conductive layer 120 is spaced along the first direction 20 from the capacitor 180. In one or more embodiments, the space between the conductive layer 120 and the capacitor 180 along the first direction 20 is in the range of 5 nm to 20 nm, or in the range of 8 nm to 15 nm, or about 10 nm.

In some embodiments, the conductive bridge 130 has a length along the first direction 20 in the range of 5 nm to 180 nm, or in the range of 5 nm to about 180 nm, or in the range of 10 nm to 150 nm, or in the range of 15 nm to 100 nm, or in the range of 20 nm to 80 nm, or in the range of 30 nm to 70 nm, or in the range of 40 nm to 60 nm. In some embodiments, the conductive bridge 130 has a length that is smaller than the length of the active region 115. In some embodiments, the conductive bridge 130 has a length that is smaller than the length of the conductive layer 120. In some embodiments, a length of the conductive bridge 130 along the first direction 20 is in the range of 10% to 90% of the length of the conductive layer 120. In some embodiments, the length of the conductive bridge 130 along the first direction 20 is in the range of 20% to 80%, or 30% to 70% or 40% to 60% of the length of the conductive layer 120.

In some embodiments, the width of the conductive bridge 130 along the second direction 30 is in the range of 50 nm to 200 nm, or in the range of 60 nm to 150 nm, or in the range of 70 nm to 125 nm, or in the range of 90 nm to 110 nm. The width of the conductive bridge 130 of some embodiments is the same as the spacing between the rows of unit cells 105.

In some embodiments, the bit line 170 has a length along the first direction 20 in the range of 50 nm to 150 nm, or in the range of 60 nm to 130 nm, or in the range of 70 nm to 110 nm, or in the range of 75 nm to 90 nm. In some embodiments, the bit line 170 has a width along the second direction 30 in the range of 50 nm to 150 nm, or in the range of 60 nm to 130 nm, or in the range of 70 nm to 110 nm, or in the range of 75 nm to 90 nm.

In some embodiments, each layer of the unit cell 105 has a height along the third direction 40 in the range of 10 nm to 50 nm, or in the range of 15 nm to 30 nm, or in the range of 20 nm to 25 nm.

In some embodiments, the memory device 100 includes a plurality of pairs of active regions spaced in the first direction 20. FIG. 3 illustrates an embodiment with a pair of active regions 115 on either side of a bit line 170 along the first direction 20. Stated differently, in some embodiments, a plurality of bit lines 170 extend along the third direction 40 between the pairs of active regions 115 spaced in the first direction 20. As shown in FIG. 3, the bit line 170 and the two active regions 115 (forming the pair of active regions) are aligned along the first direction 20 (the X-axis direction).

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface. The substrate of some embodiments comprises one or more of an insulator, a metallization layer or a peripheral circuit. In the illustrated embodiment, for example, the substrate comprises an insulator.

FIGS. 5 through 19 illustrate one or more methods for forming the memory device 100 illustrated in FIGS. 3 and 4. For ease of description, each of FIGS. 6 through 13 are broken into 5 views. Each of the numbered views, the views without an appended letter (e.g., FIG. 6), show a view looking down the third direction 40 (Z-axis) at a plane formed by the first direction 20 (X-axis) and second direction 30 (Y-axis). Each of the 'A' views (e.g., FIG. 6A) and 'B' views (e.g., FIG. 6B) show the electronic device looking along the second direction 30 (Y-axis) at a plane formed by the first direction 20 (X-axis) and third direction 40 (Z-axis). The 'A' views are a slice of the device of the corresponding numbered view taken along line A-A. The 'B' views are a slice of the device of the corresponding numbered view taken along line B-B. The 'C' views (e.g., FIG. 6C) and 'D' views (e.g., FIG. 6D) show the electronic device viewed along the first direction 20 (X-axis) at a plane formed by the second direction 30 (Y-axis) and third direction 40 (Z-axis). The 'C' views are a slice of the device of the corresponding numbered view taken along line C-C. The 'D' views are a slice of the device of the corresponding numbered view taken along line D-D. Each of FIGS. 14-19 shows a view of the electronic device similar to the 'B' views of FIGS. 6-13. The illustration in FIGS. 14-19 show a slice of the electronic device looking along the second direction 30 (Y-axis) at a plane formed by the first direction 20 (X-axis) and third direction 40 (Z-axis).

Figure 5:
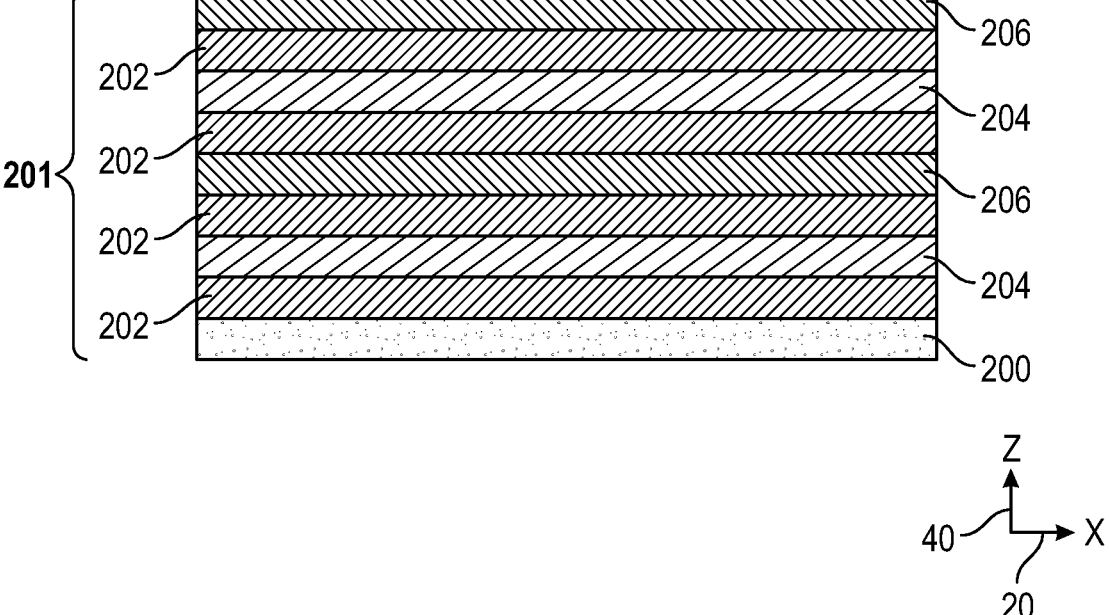
FIG. 5 illustrates a cross-sectional schematic view of a film stack for a memory device according to one or more embodiment of the disclosure.
Figure 9:
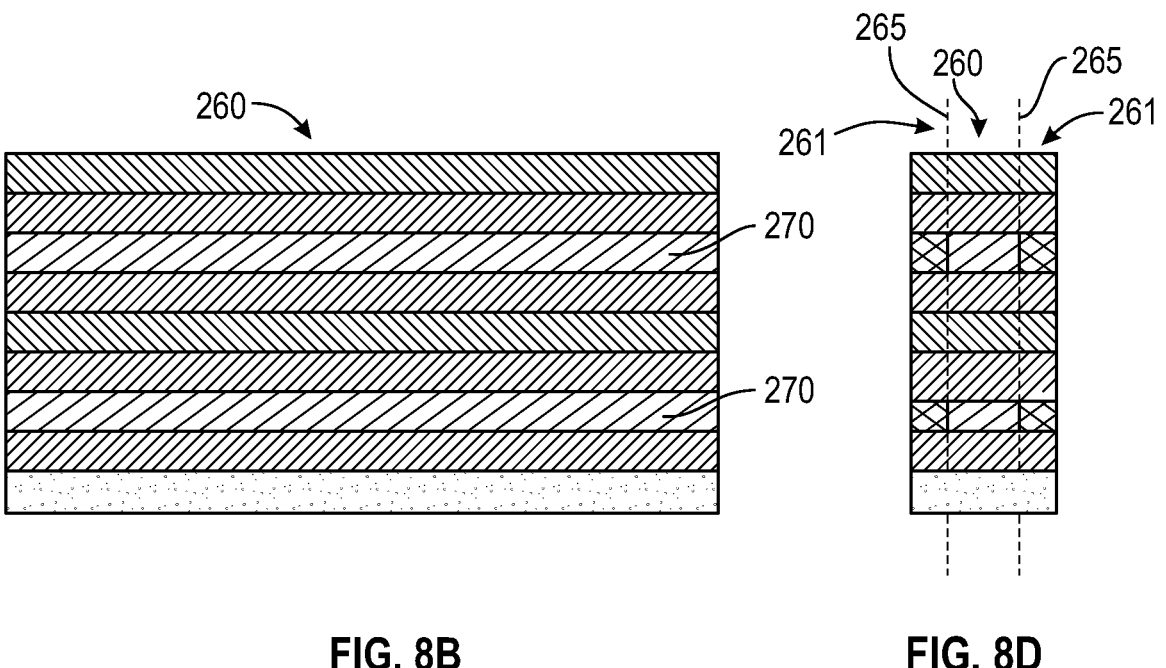
FIG. 9 illustrate a schematic top view of a memory device after trench formation according to one or more embodiments.
Figure 9:
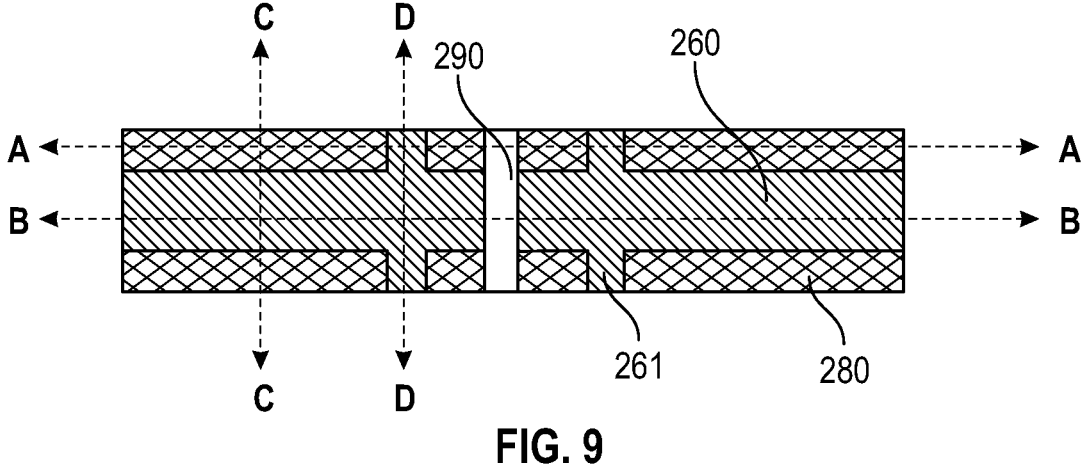
Figure 9A:
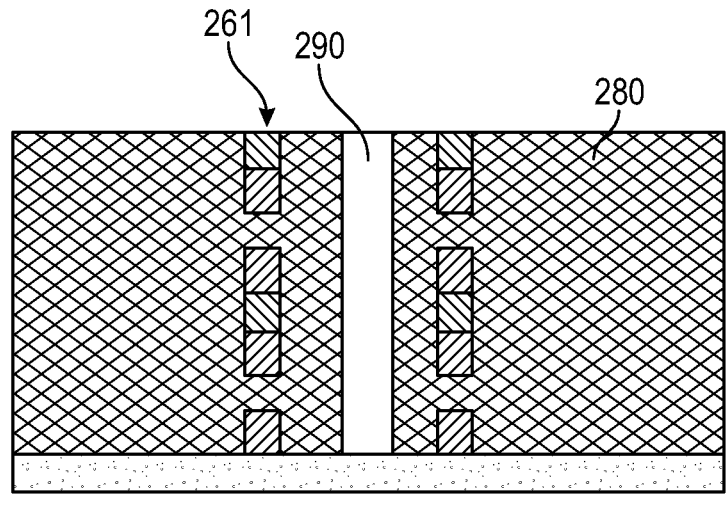
FIG. 9A illustrates a cross-sectional slice of a memory device taken along line A-A of FIG. 9.
Figure 9C:
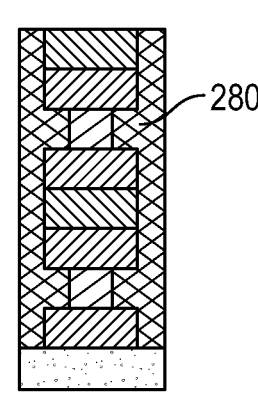
FIG. 9C illustrates a cross-sectional slice of a memory device taken along line C-C of FIG. 9.
Figure 9B:
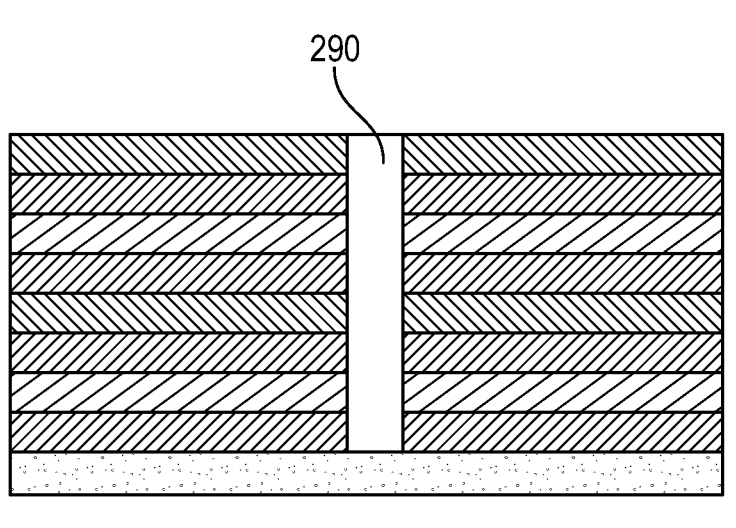
FIG. 9B illustrates a cross-sectional slice of a memory device taken along line B-B of FIG. 9.
Figure 9D:
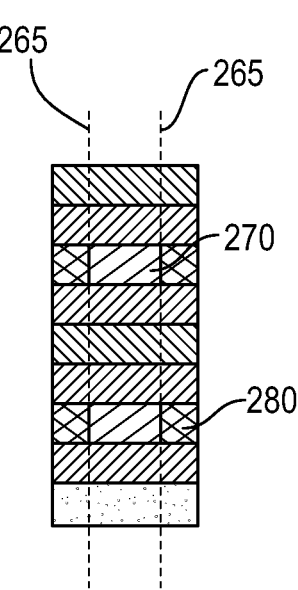
FIG. 9D illustrates a cross-sectional slice of the memory device taken along line D-D of FIG. 9.
Figure 10:
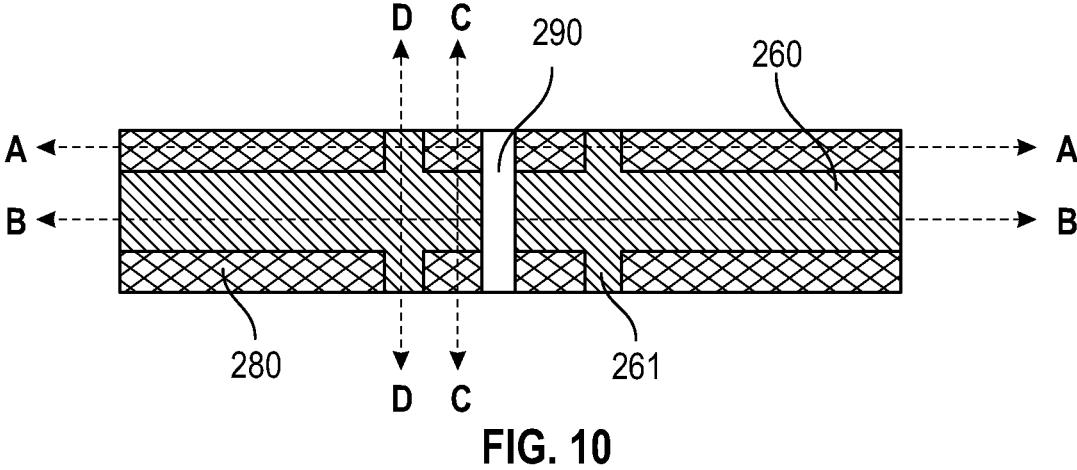
FIG. 10 illustrate a schematic top view of a memory device after dielectric pullback according to one or more embodiments.
Figures 10A, 10C:
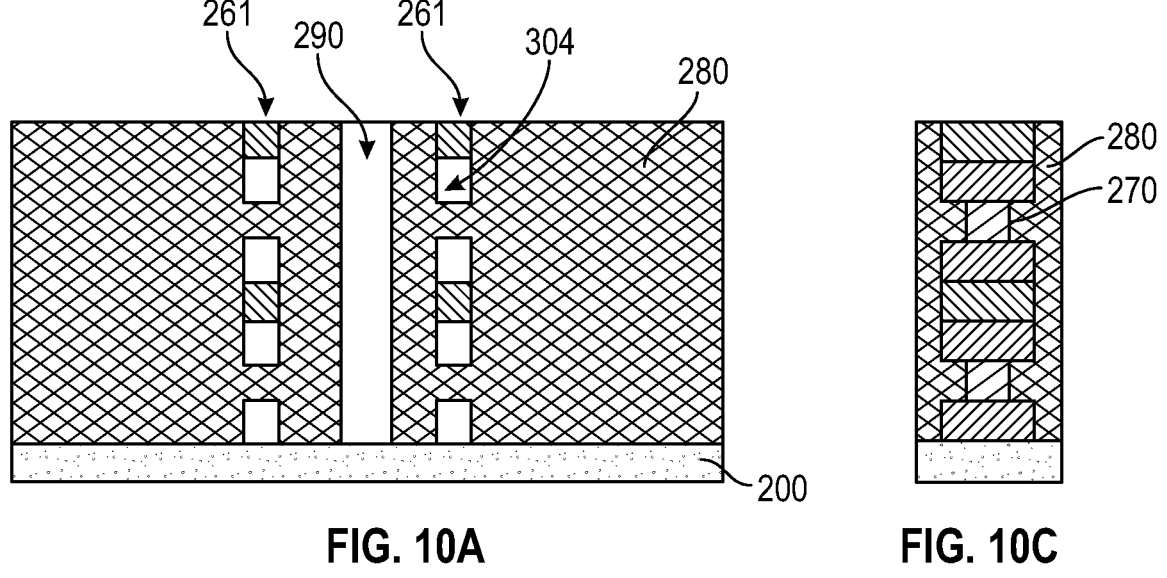
FIG. 10A illustrates a cross-sectional slice of a memory device taken along line A-A of FIG. 10.
FIG. 10C illustrates a cross-sectional slice of a memory device taken along line C-C of FIG. 10.

FIG. 5 shows a substrate 200 with a stack 201 of layers formed thereon. The layers of the stack 201 are formed generally in the plane formed by the first direction (X-axis)

and the second direction (Y-axis) with a thickness (shown from top to bottom of the printed page) along the third direction (Z-axis), and each layer is at a greater height along the third direction 40 (Z-axis) than the layer below.

The stack 201 of layers illustrated comprises sacrificial layers 202 alternating with channel layers 204 and insulator layers 206. In the illustrated embodiment, each of the channel layers 204 is sandwiched between sacrificial layers 202. During the process, the active region 115 will be located where the channel layers 204 are and the sacrificial layers 202 will be replaced with word lines 125 made up of conductive layers 120 and bridges 130. With a sacrificial layer 202 above and below the channel layers 204, there will be word lines 125 both above and below the active region 115, as shown in FIG. 3. If the channel layers 204 only had a sacrificial layer 202 below the active region 115, there would be one word line formed below the active region 115, as shown in FIG. 4.

FIGS. 6 and 6A-6D illustrate the electronic device after patterning the stack 201 to form an isolated film stack 260 and a pair of pre-bridge stacks 261. The isolated film stack 260 extends along the first direction 20 (X-axis) as shown in FIGS. 6, 6B and 6D. As used in this manner, the term "extends along" means that the longer axis of the stated component is the stated axis or direction. For example, extending along the first direction means that the component has a longer axis in the X-direction. For a stack of films, the longer axis is considered for an individual film, not the entire stack of films which could be much larger than the eight layers illustrated.

The pre-bridge stacks 261 are formed on either or both sides 265 of the isolated film stack 260 and extend along the second direction 30 (Y-axis). The pre-bridge stacks 261 create an opening 263 between the pre-bridge stacks 261 and openings 264 outside the pre-bridge stacks 261, along the first direction 20 (X-axis). The openings 264 form a gap along the second direction 30 (Y-axis) between the isolated film stack 260 and an adjacent isolated film stack.

Patterning can be done by any suitable technique known to the skilled artisan. For example, in some embodiments, patterning the stack 201 comprises forming a patterned hard mask (not shown) on the top of the stack 201, followed by etching the film stack 201 (e.g., by an anisotropic etch) through openings in the patterned hard mask. The top view illustrated in FIG. 6 shows the device after etching leaving a pattern 262 in the insulator layer 206. The patterned hard mask of some embodiments is a negative of the pattern formed so that open areas in the hard mask result in removal of the film stack.

The pair of pre-bridge stacks 261 are separated along the first direction 20 (X-axis) to create an opening 263 between the pair of pre-bridge stacks 261. In some embodiments, the patterning process creates openings 264 outside the pair of pre-bridge stacks 261. The skilled artisan will recognize that the illustrated process isolates the pair of pre-bridge stacks 261 in the first direction 20 (X-axis). The width of the pre-bridge stacks 261, along the first direction 20 (X-axis) of some embodiments is about the same as the width of the bridges 160. The distance between the pair of pre-bridge stacks 261, which is the width along the first direction 20 of the opening 263, is the distance between bridges 160, along the first direction 20.

FIGS. 7 and 7A-7D illustrate the electronic device after removal of the channel layer 204 from the pre-bridge stacks 261 and recessing the channel layer 204 into the isolated film stack 260 to form recessed channel layers 270 in the isolated film stack 260. The removal process occurs through opening 263 and openings 264 and leaves an opening 271 where the channel layers 204 were removed. The channel layer 204 can be removed by any suitable technique known to the skilled artisan. In some embodiments, removal of the channel layer 204 is done by a dry process or oxidation process. FIG. 7A shows that the etch process removes the channel layers 204 from the pre-bridge stacks 261 to form openings 271 in the pre-bridge stacks 261. FIGS. 7C and 7D show that the etch process removes a portion of the channel layers 204 to form recessed channel layers 270 in the sides 265 of the isolated film stack 260 with openings 271. The sides 265 of the isolated film stack 260 are shown in FIG. 7D as dotted lines. The center portion of the isolated film stack 260 shown in FIG. 7B is unchanged.

The process of recessing the channel layer 204 forms the inner edge of the active region 115, as shown in FIG. 3. As used in this manner, the term "inner edge" means the edge of the active region closest to the bit line 170 along the first direction 20. The term "outer edge" means the edge of the active region 115 furthest from the bit line 170 along the first direction. The distance between the inner edge and outer edge of the active region 115 is the length of the active region 115.

FIGS. 8 and 8A-8D illustrate the electronic device after filling the openings 263, 264, 271 with a dielectric material 280. In some embodiments, the dielectric material is an oxide fill. The dielectric material 280 (also referred to as the oxide fill) is deposited through openings 263, 264, filling fill opening 271. In some embodiments, the dielectric material 280 is deposited with an overburden and then planarized such that the dielectric material is substantially coplanar with the top surface of the isolated film stack 260. In one or more embodiments, the oxide fill comprises one or more of oxides, carbon doped oxides, silicon oxide (SiO), porous silicon dioxide (SiO$_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH). The dielectric material 280 may be deposited by any technique known to one of skill in the art, including, but not limited to, atomic layer deposition or chemical vapor deposition.

FIGS. 9 and 9A-9D illustrate the electronic device after forming a trench 290 in the isolated film stack 260. The trench 290 is formed along the second direction 30 (Y-axis) and is positioned between the pair of pre-bridge stacks 261, along the first direction 20. The trench 290 separates the isolated film stack 260 into two isolated film stack sections 260a, 260b. In the following descriptions, the isolated film stack 260 is used to describe both isolated film stack sections 260a, 260b unless otherwise specifically stated. Ultimately, the bit line 170 will be formed in the trench 290 so that two unit cells 105 are formed. The trench 290 can be formed by any suitable technique known to the skilled artisan. For example, in some embodiments, a patterned mask is applied followed by etching.

The C-C line illustrated in FIGS. 10 through 13 is different than those of FIGS. 6 through 9. The portion illustrated in FIGS. 6 through 9 remains unchanged in the processes described in FIGS. 10 through 13. FIGS. 10 and 10A-10D illustrate the electronic device after removing a portion of the sacrificial layer 202 from the isolated film stack 260. The sacrificial layer 202 is removed through the trench 290 to form a recessed sacrificial layer 300. Recessing the sacrificial layer 202 to form the recessed sacrificial layer 300 exposes at least one surface 301 and an end surface 303 of the recessed channel layers 270. In the illustrated embodiment, the recessed channel layer 270 has two surfaces 301, 302 and the end surface 303. When the sacrificial layer 202 is recessed, the surface 305 of the sacrificial layer 202 moves away from the trench 290 in the first direction 20 and forms a word line opening 304. The word line opening 304 is bounded by the surface 305 of the recessed sacrificial layer 300, the surfaces 301, 302 of the recessed channel layer 270 and the trench 290. The sacrificial layer 202 can be recessed by any suitable technique known to the skilled artisan.

FIGS. 11 and 11A-11D illustrate the electronic device after forming a gate oxide layer 140 in the word line opening 304. The gate oxide layer 140 is deposited through the trench 290 by any suitable technique known to the skilled artisan. The illustrated embodiment shows the gate oxide layer 140 as a conformal layer with a uniform shape. However, the skilled artisan will recognize that this is merely for illustrative purposes and that the gate oxide layer 140 can form in an isotropic manner so that the gate oxide layer 140 has a rounded appearance. In some embodiments, the gate oxide layer 140 is selectively deposited as a conformal layer on the surface of the recessed channel layer 270. The gate oxide layer 140 of some embodiments forms on the end surface 303 of the recessed channel layer 270. In some embodiments, the gate oxide layer 140 formed on the end surface 303 is removed by an anisotropic etch process to expose the end surface 303 and leave the gate oxide layer 140 on the surfaces 301, 302. In some embodiments, the gate oxide layer 140 is formed by oxidation of the semiconductor surface.

In one or more embodiments, the gate oxide layer 140 comprises a gate oxide material. In one or more embodiments, the gate oxide layer 140 comprises one or more of silicon oxynitride (SiON), silicon oxide, or a high-K dielectric material. While the term "silicon oxide" may be used to describe the gate oxide layer 140, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

FIGS. 12 and 12A-12D illustrate the electronic device after depositing an optional liner 325 and a conductive layer 120 in the word line opening 304. The conductive layer 120 has an outer end 121 and an inner end 122 that is closer to the trench 290 than the outer end 121. The conductive layer 120 forms a word line and bridges 130 in the electronic device on the gate oxide layers 140. The illustrated embodiment shows the optional liner 325 as a conformal layer with a uniform shape. However, the skilled artisan will recognize that this is merely for illustrative purposes and that the optional liner 325 can form in an isotropic manner. The cross sectional view of FIGS. 12A and 12D illustrates the bridges 130 and the view of FIGS. 12B and 12C illustrates the conductive layers 120.

In one or more embodiments, the word line metal 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The conductive layer 120 (word line metal) is deposited using any one of a number of methods known to one of skill in the art, including, but not limited to, chemical vapor deposition, physical vapor deposition, or atomic layer deposition. In some embodiments, the bridge section (shown in FIG. 12D) is filled with the word line metal.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

FIGS. 13 and 13A-13D illustrate the electronic device after filling the trench 290 with a dielectric 230. In some embodiments, the dielectric 230 forms an electrical boundary on the inner side of the word line. The dielectric material is deposited using any one of a number of methods known to one of skill in the art, including, but not limited to, chemical vapor deposition, physical vapor deposition, or atomic layer deposition. The dielectric material can be the same composition as any of the other insulating materials in the electronic device. In some embodiments, the dielectric 230 is the same material as dielectric material 280. In some embodiments, the dielectric 230 is etch selective relative to the dielectric material 280. In some embodiments, prior to filling the trench with dielectric 230, the inner end of the recessed channel layer 270 is doped to form a source/drain region 119.

Figure 13:
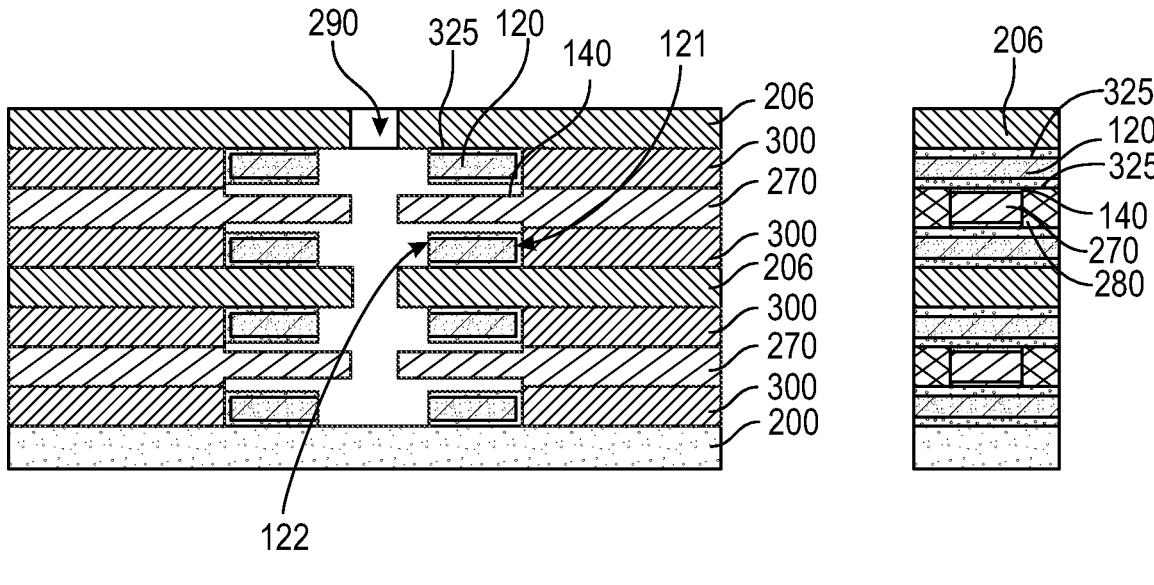
FIG. 13 illustrate a schematic top view of a memory device after an oxide fill according to one or more embodiments.
Figure 13:
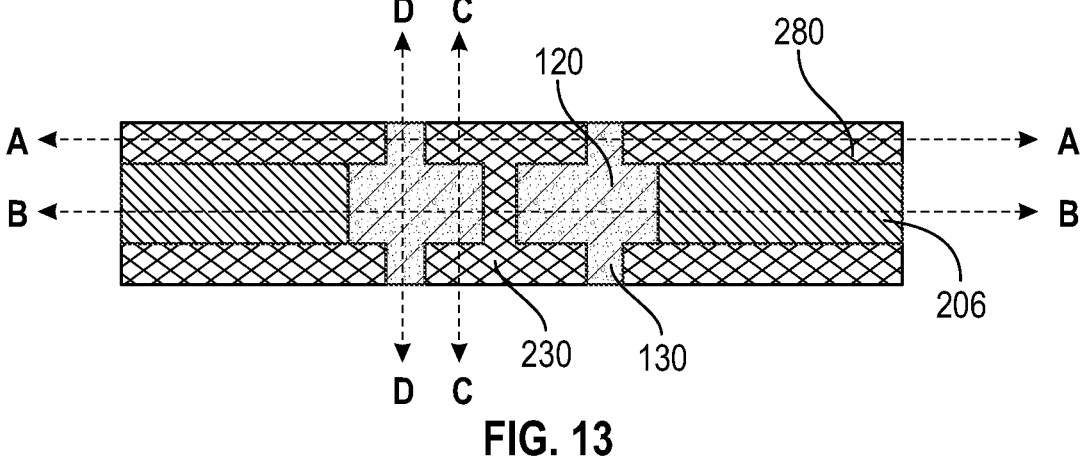
Figure 14:
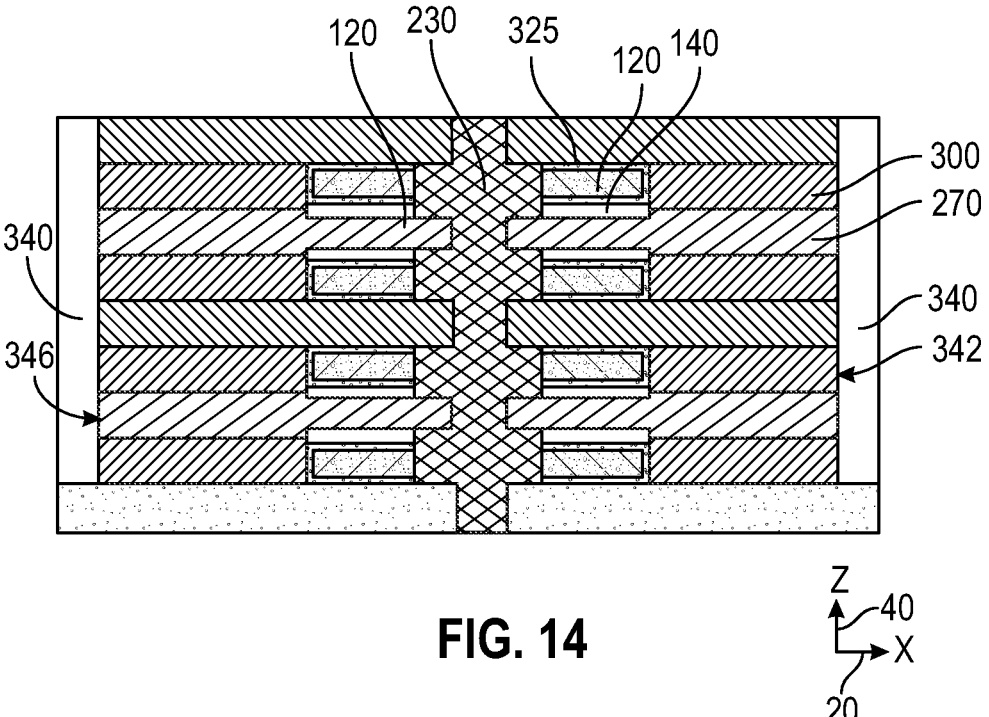
FIG. 14 illustrates a cross-sectional slice of a memory device after slit patterning according to one or more embodiments.

Each of FIGS. 14-19 shows a view of the electronic device taken along line B-B of FIG. 13. Each of these Figures is a view along the second direction 30 at a slice taken in a plane formed by the first direction 20 and the third direction 40. FIG. 14 illustrates the electronic device after forming a slit pattern 340 through the recessed sacrificial layer 300 and the recessed channel layer 270 to form the slit pattern 340. The slit pattern 340 is formed on the opposite sides of the location here the trench 290 was filled with dielectric 230. As used in this manner, "opposite sides" means that one slit is formed to one side of the dielectric 230 in the first direction 20 and the other slit is formed on the other side of the dielectric 230 in the first direction 20. The slit pattern 340 is formed outside of the conductive layer 120 formed in the word line opening. As used in this manner, the term "outside of" means that the slit pattern 340 is formed on an opposite side of the conductive layer 120 than the dielectric 230. In the illustration of FIG. 14, the dielectric 230 is in the center of the drawing, the conductive layers 120 are to the left and right of the dielectric 230 and the slit patterns 340 are on the left edge and right edge of the drawing; opposite sides of the dielectric 230 and outside of the conductive layers 120. The slit pattern 340 exposes the sidewall 346 of the recessed channel layer 270 and the sidewall 342 of the recessed sacrificial layer 300.

Figure 15:
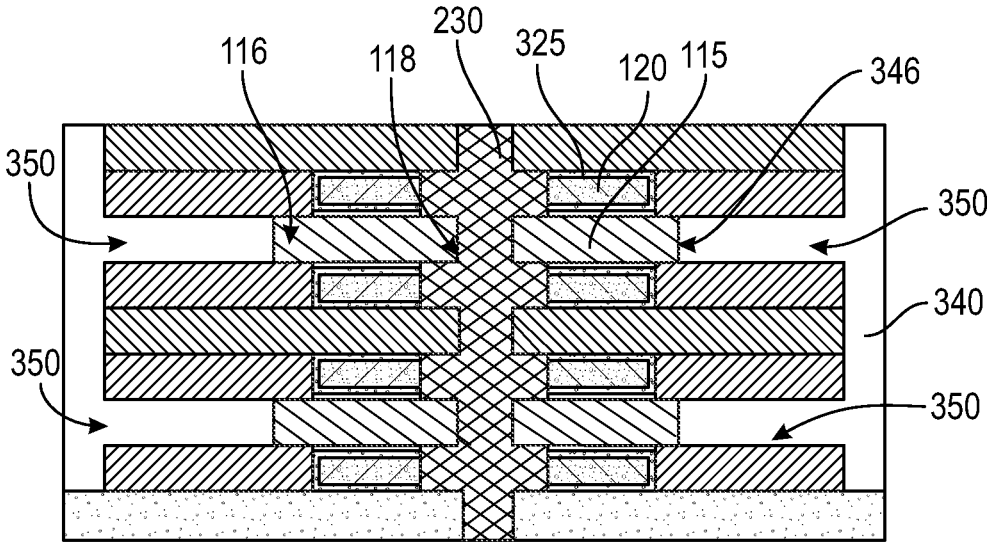
FIG. 15 illustrates a cross-sectional slice a memory device after forming a capacitor opening according to one or more embodiments.

FIG. 15 shows the electronic device after a portion of the recessed channel layer 270 is removed through the slit pattern 340 to move the sidewall 346 of the recessed channel layer 270 toward the conductive layer 120. This process recesses the recessed channel layer 270 from the slit pattern 340 side. The portion of the recessed channel layer 270 can be removed by any suitable technique known to the skilled artisan. Removing the portion of the recessed channel layer 270 forms the active region 115 and a capacitor opening 350. The active region 115 has an outer end 116 adjacent the capacitor opening 350 and an inner end 118 adjacent the dielectric 230. This process may also be referred to as a "pull back" process. In one or more embodiments, the recessed channel layer 270 comprises poly-silicon and the process shown in FIG. 15 is a poly-silicon pull back.

Figure 16:
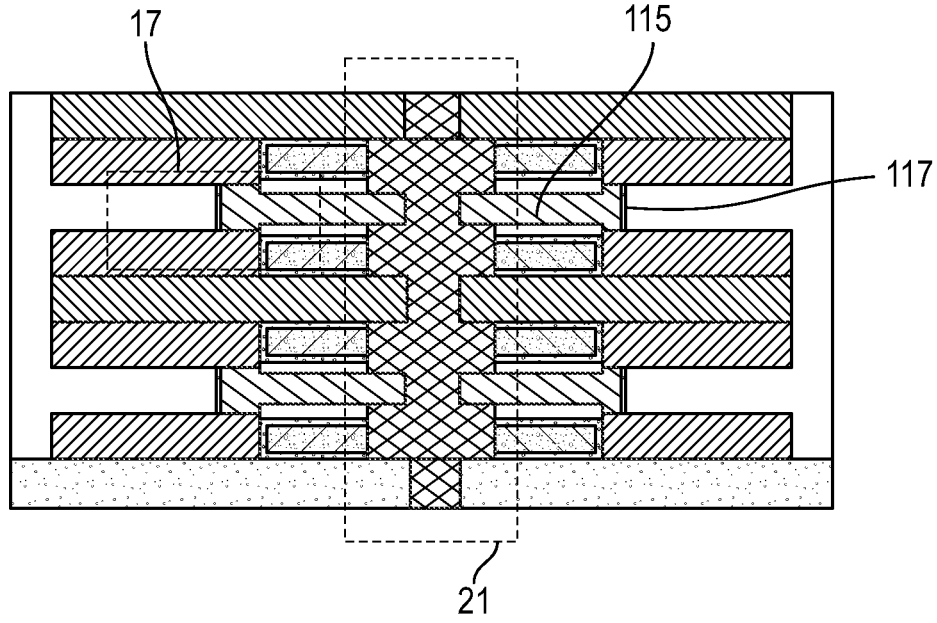
FIG. 16 illustrates a cross-sectional view of a memory device after doping of the active region according to one or more embodiments.

FIG. 16 shows the electronic device after an optional gas phase doping process. The gas phase doping process forms a doped layer 117 on the outer edge of the active region 115. In some embodiments, doping is performed during deposition of the active region material using a dopant source. For example, a phosphorous doped silica glass (PSG) or boron phosphorous doped glass (BPSG) and diffused into the material. In some embodiments, the doped layer 117 is in the range of 1 to 20 nm thick (measured from the outer edge of the active region 115 toward the bit line).

Figure 17:
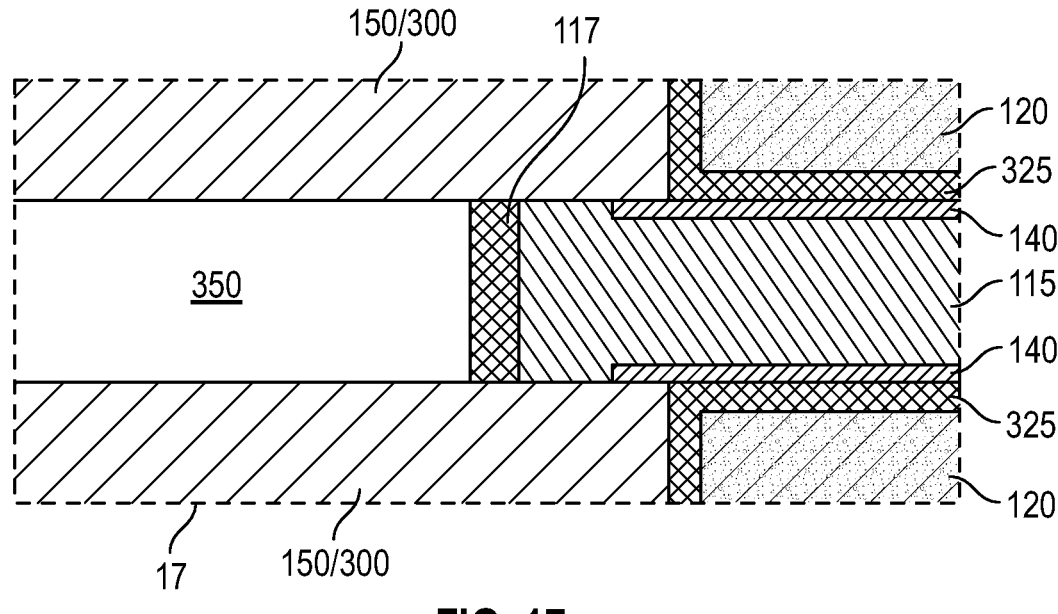
FIG. 17 illustrates an expanded cross-sectional view of region 17 of FIG. 16.
Figure 18:
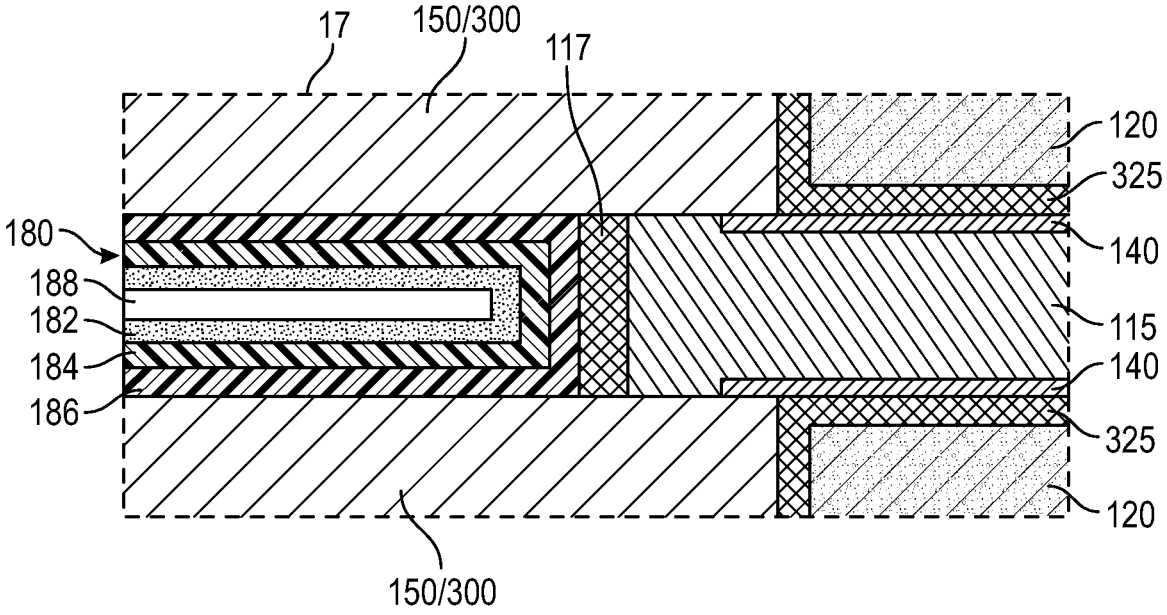
FIG. 18 illustrates an expanded cross-sectional view of a memory device after capacitor formation according to one or more embodiments.

FIG. 17 shows an expanded view of region 17 of FIG. 16 showing the capacitor opening 350. As shown in FIG. 18, in some embodiments, a capacitor 180 is formed in the capacitor opening 350 adjacent the recessed channel layer 270. In some embodiments, the capacitor 180 is formed by first depositing a lower electrode 186 in the capacitor opening 350. The lower electrode 186, also referred to as a bottom electrode or bottom contact, can be formed by any suitable technique known to the skilled artisan. In some embodiments, the lower electrode 186 is a conformal film deposited by atomic layer deposition. In one or more embodiments, the lower electrode 186 comprises a material selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In some embodiments, the capacitor comprises a bottom electrode, a capacitor dielectric and a top electrode. In some embodiments, the capacitor comprises a double layer. For example, the top electrode and a titanium nitride plus silicon germanium double layer.

A high-K dielectric 184 is deposited on the lower electrode 186 within the capacitor opening 350. The high-K dielectric 184 of some embodiments comprises hafnium oxide. In some embodiments, the high-K dielectric 184 is deposited as a conformal film by atomic layer deposition. A top electrode 182 is formed in the capacitor opening 350 within the high-K dielectric 184. The top electrode 182, also referred to as a top contact or upper electrode, can be formed by any suitable technique known to the skilled artisan. In one or more embodiments, the top electrode 182 comprises a conductive material comprising one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). in some embodiments, a dielectric 188 is deposited to fill any open space remaining in the capacitor opening 350 after formation of the top electrode 182. The dielectric 188 of some embodiments separates the individual unit cells from adjacent unit cells to prevent shorting.

Figure 19:
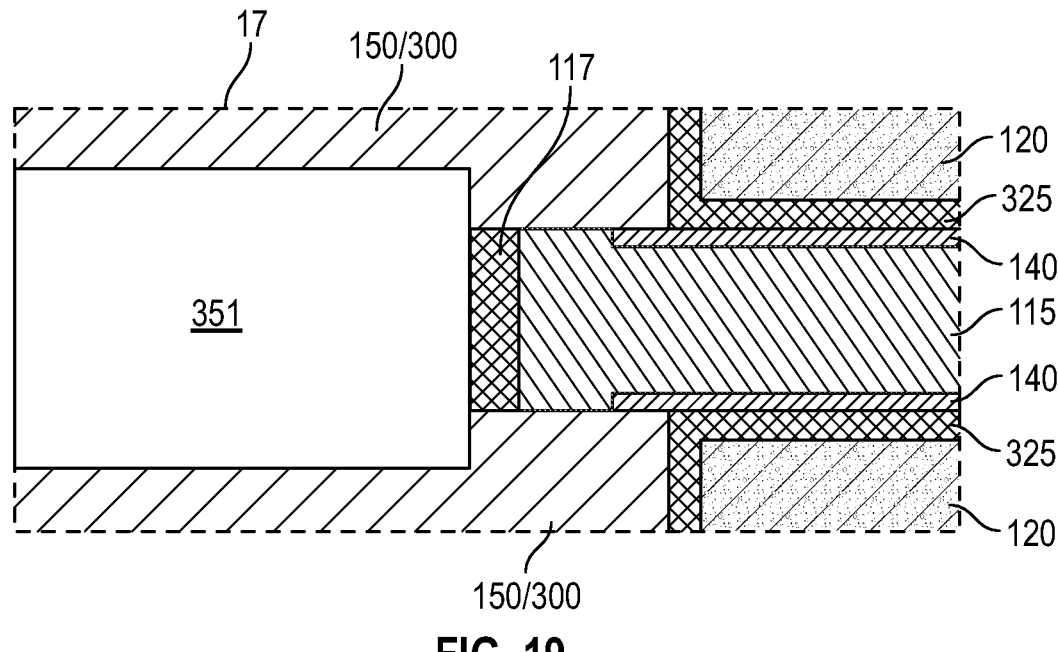
FIG. 19 illustrates an expanded cross-sectional view of region 17 of FIG. 16 of the memory device after expanding the capacitor opening according to one or more embodiments.

FIG. 19 illustrates region 17 of another embodiment of the disclosure in which the capacitor opening 350 is widened prior to forming the capacitor to create a widened capacitor opening 351. The capacitor opening 350 can be widened by any suitable technique known to the skilled artisan. After the capacitor opening 350 has been widened, a capacitor 180 is formed within, as shown in FIG. 20. The capacitor opening of some embodiments is widened by a percentage of a thickness of the isolation layer (layer between active regions). In some embodiments, the capacitor is widened by an amount in the range of 10% to 80% of the thickness of the isolation layer (measured as the combination of top and bottom widening). In some embodiments, the capacitor is widened by an amount in the range of 20% to 75%, or in the range of 30% to 60%. The capacitor opening 350 of some embodiments is widened in the second direction 30 (Y-axis) and the third direction 40 (Z-axis). In some embodiments, the capacitor opening 350 is widened using a dilute HF (~1% HF in water) wet etch. In some embodiments, widening the capacitor opening results in an increase in capacitor surface area in the range of 1% to 85%, or in the range of 5% to 80%, or in the range of 10% to 75%, or in the range of 20% to 60%.

Figures 21, 22, 23:
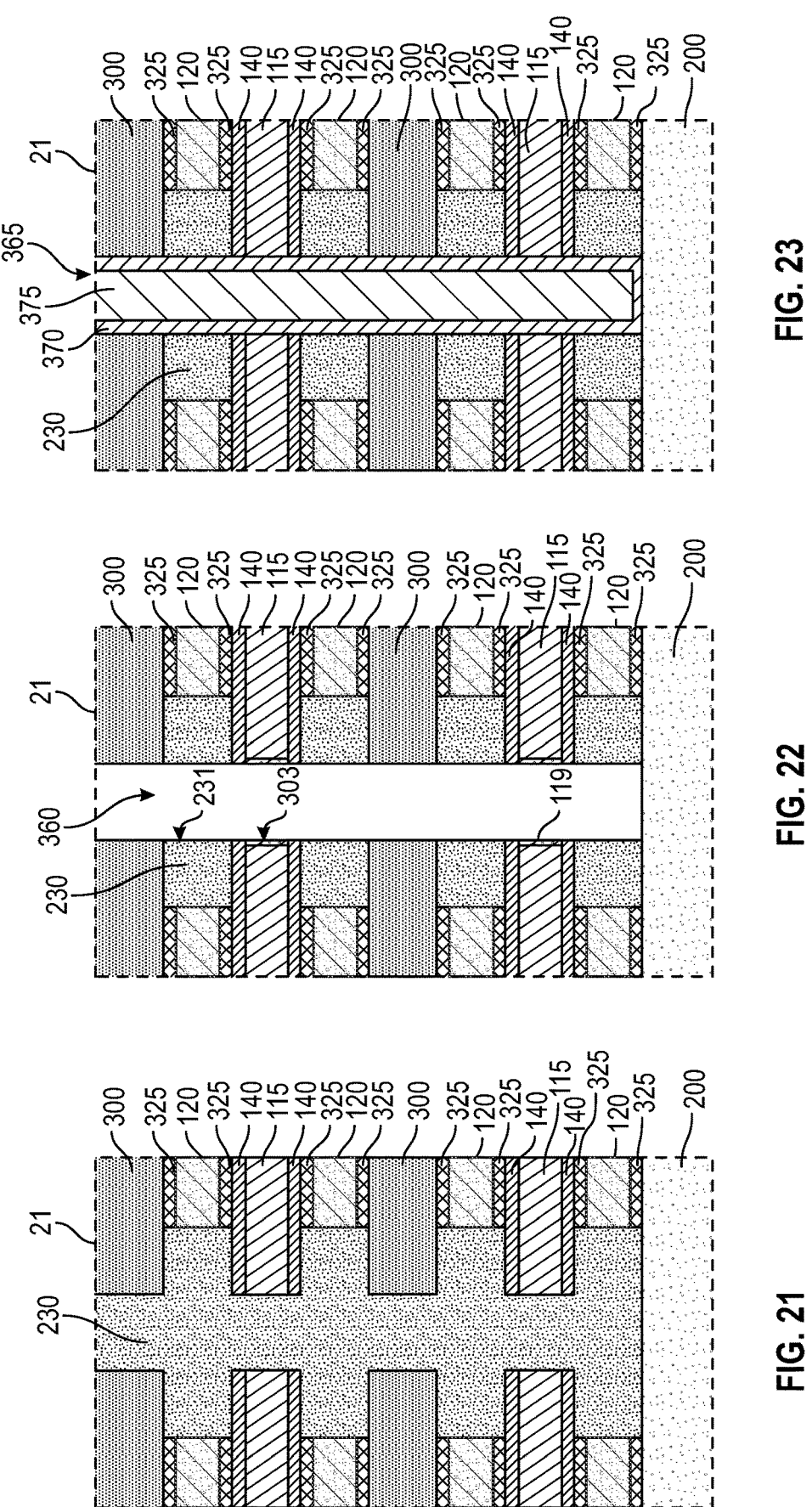
FIG. 21 illustrates an expanded cross-sectional view of region 21 of FIG. 16.
FIG. 22 illustrates an expanded cross-sectional view of the memory device after forming a bit line opening and source/drain region according to one or more embodiments.
FIG. 23 illustrates an expanded cross-sectional view of a memory device after forming a liner and bit line according to one or more embodiments.

FIG. 21 illustrates a partial view of region 21 of FIG. 16. FIG. 22 shows the electronic device after forming a bit line hole 360 (also referred to as a bit line opening) between the recessed channel layers that form the active region 115. In some embodiments, the electronic device is patterned to form the plurality of bit line holes 360. The bit line hole 360 can be formed by any suitable process known to the skilled artisan. In some embodiments, the bit line hole 360 is formed by positioned a patterned hard mask and etching the dielectric 230 through the hard mask.

In the illustrated embodiment, a source/drain region 119 is formed on the inner end of the active region 115. In some embodiments, the source/drain region 119 is formed by exposing the end surface 303 to a dopant gas. The source/drain region 119 can be formed by any suitable technique known to the skilled artisan.

FIG. 22 illustrates the partial view of region 21 of FIG. 16 after depositing a bit line 365 in the bit line hole 360. In the illustrated embodiment, the bit line 365 includes an optional bit line liner 370 (also referred to as a bit line barrier layer) and a bit line metal 375.

The optional bit line liner 370 can be made of any suitable material deposited by any suitable technique known to the skilled artisan. In some embodiments, the bit line liner 370 is conformally deposited in the plurality of bit line holes 360 and deposited on an exposed surface of the dielectric 231 and the end surface 303 (or exposed surface) of the active region 115. In the illustrated embodiment, the bit line liner 370 is deposited on the source/drain region 119 at the inner end of the active region 115. The bit line liner 370 can be any suitable material including, but not limited to, titanium nitride (TIN) or tantalum nitride (TaN). In some embodiments, the optional bit line liner 370 comprises or consists essentially of titanium nitride (TIN). As used in this manner, the term "consists essentially of" means that the composition of the film is greater than or equal to about 95%, 98%, 99% or 99.5% of the stated species. In some embodiments, the optional bit line liner 370 comprises or consists essentially of tantalum nitride (TaN). In some embodiments, the bit line liner 370 is a conformal layer. In some embodiments, the bit line liner 370 is deposited by atomic layer deposition.

In some embodiments, the bit line metal 375 comprises or consists essentially of one or more of tungsten silicide (Wsi), tungsten nitride (WN), or tungsten (W). The bit line metal 375 can be deposited by any suitable technique known to the skilled artisan and can be any suitable material. In one or more embodiments, forming the bit line metal 375 further comprises forming a bit line metal seed layer (not shown) prior to depositing the bit line metal 375.

Figure 24:
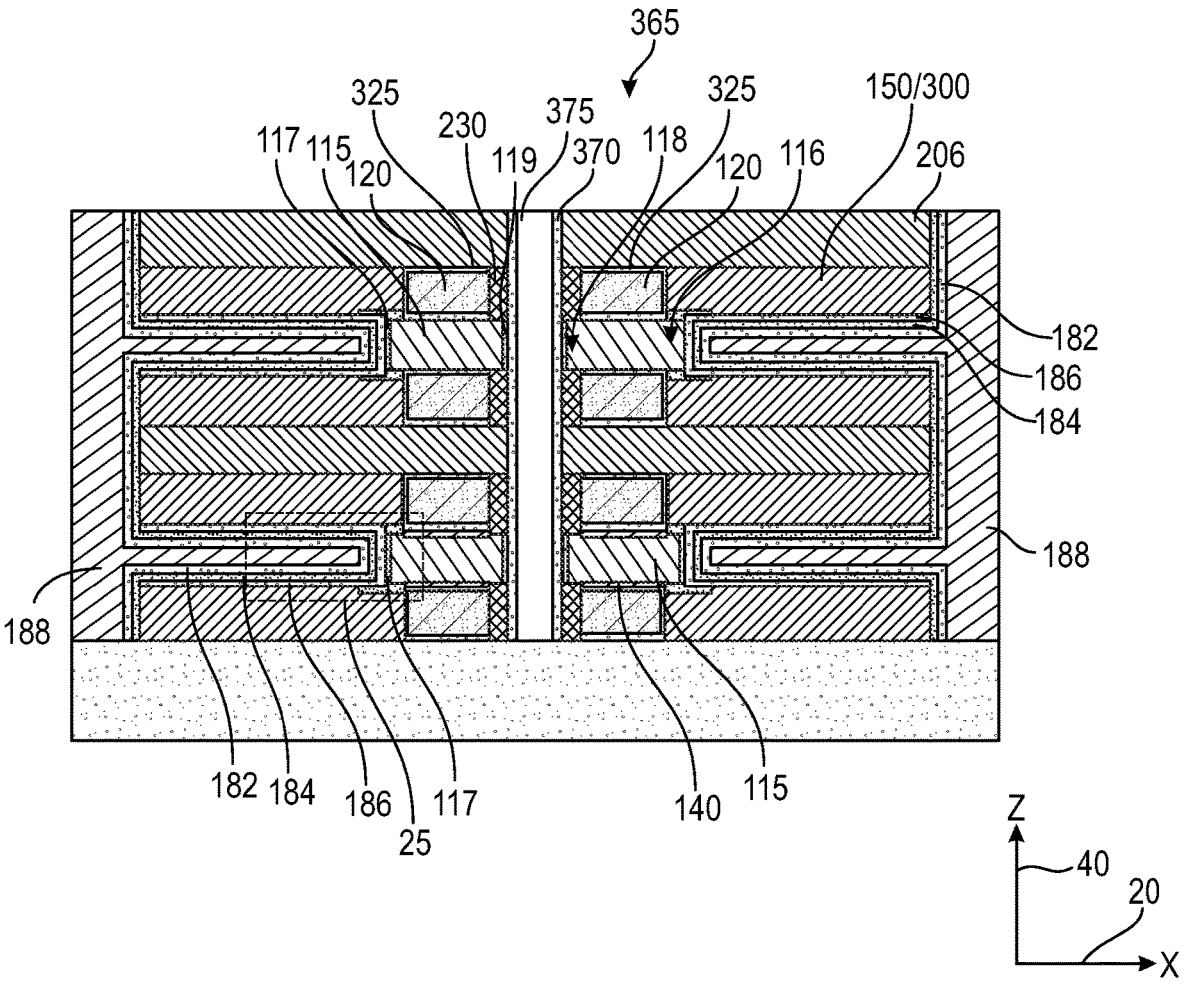
FIG. 24 illustrates a schematic view of a memory device according to one or more embodiment of the disclosure.
Figure 25:
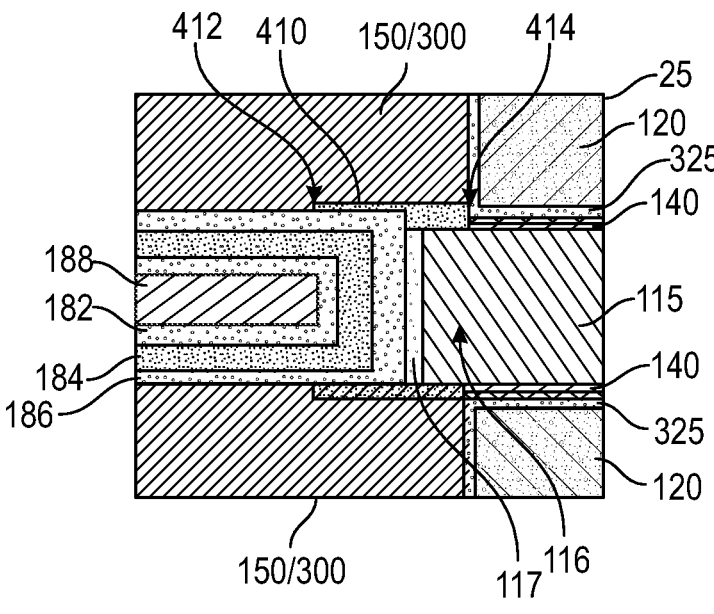
FIG. 25 illustrates an expanded view of region 25 of FIG. 24.

Some embodiments of the disclosure are directed to electronic devices incorporating an etch stop layer (ESL) for improved process controls. FIGS. 24 through 33 show cross-sectional schematic views of an electronic device similar to that illustrated in FIG. 3. The skilled artisan will recognize the similarities between the process described in FIGS. 26-33 with the process described in FIGS. 5-23. The view of FIG. 24 is taken along the second direction 30 (Y-axis) looking at a plane formed by the first direction 20 (X-axis) and third direction 40 (Z-axis). FIG. 25 shows an expanded view of region 25 from FIG. 24.

In the illustrated embodiment, an etch stop layer 410 is adjacent to the outer end 116 of the active region 115. The etch stop layer 410 is adjacent to the lower electrode 186 of the capacitor along the third direction 40 (Z-axis) and adjacent to the outer end 116 of the active region 115 along the third direction 40 (Z-axis). The etch stop layer 410 of some embodiments is adjacent the doped layer 117 along the third direction 40 (Z-axis) and the outer end 116 of the active region 115 along the third direction 40 (Z-axis). In some embodiments, the etch stop layer 410 is adjacent the doped layer 117 and the lower electrode 186 of the capacitor along the third direction 40 (Z-axis). In some embodiments, the etch stop layer 410 is substantially absent from a region between the outer end 116 of the active region 115 (and/or the doped layer 117) and the capacitor 180, along the first direction 20. As used in this manner, the term "substantially absent" means that the etch stop layer 410 occupies less than 25%, 20%, 10% or 5% of the area between the active region 115 and the lower electrode 186 along the first direction 20 (X-axis).

Figure 26:
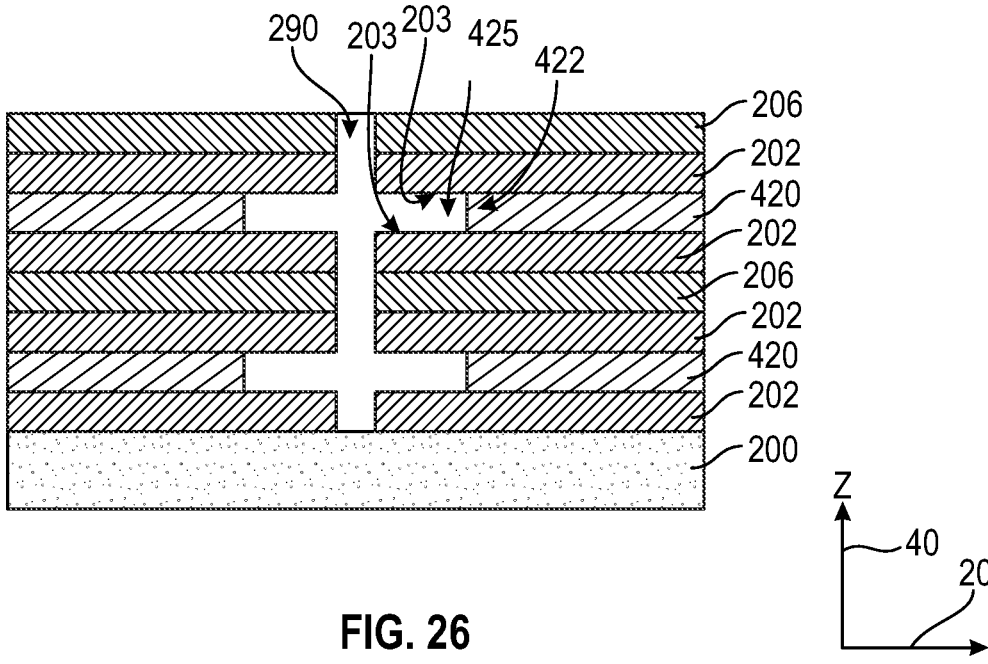
FIG. 26 illustrates a cross-sectional view of the memory device of FIG. 24 after trench formation and replacement gate pullback according to one or more embodiments.

One or more embodiments of the disclosure are directed to methods of manufacturing the electronic device of FIG. 24. FIG. 26 shows an embodiment of the electronic device in which a trench 290 has been formed through a stack of alternating sacrificial layers 202 and replacement channel layers 420. The replacement channels layers 420 of some embodiments are the same material as the channel layers 204 shown in FIGS. 5-23. In some embodiments, the replacement channel layers 420 are a different material than the channel layers 204 shown in FIGS. 5-23. The material of the replacement channel layers 420 does not affect the process flow described.

After forming the trench 290, as shown in FIG. 26, the replacement channel layers 420 are recessed to form recessed replacement channel layers 420 as shown and opening 425 between adjacent sacrificial layers 202 (if there are two) in the third direction 40 (Z-axis). The replacement channel layers are recessed to a depth sufficient to form an active material of a predetermined length in the final electronic device. In the illustrated embodiment, the opening 425 is bounded along the first direction 20 (X-axis) by the inner end 422 of the recessed replacement channel layers 420 and the trench 290, and bounded along the third direction 40 (Z-axis) by the exposed surfaces 203 of the sacrificial layers 202 above and below.

Figure 27:
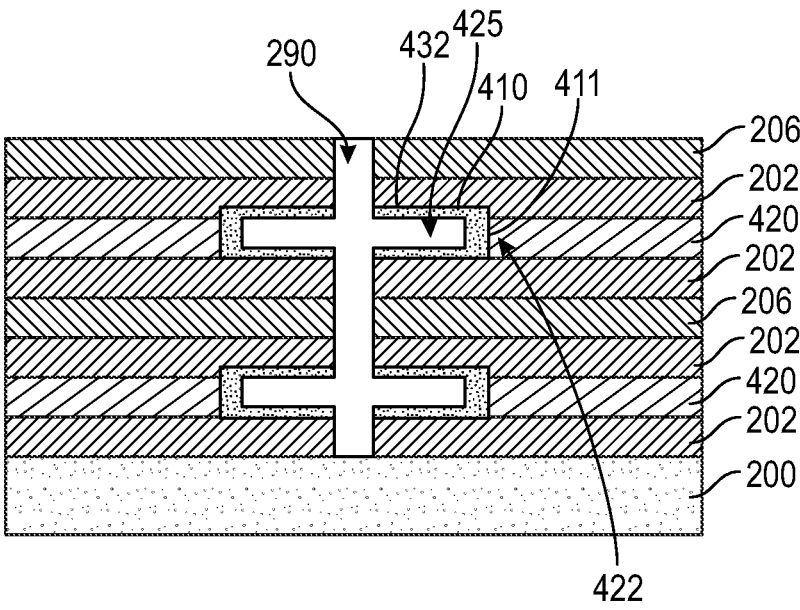
FIG. 27 illustrates an expanded cross-sectional view of the memory device of FIG. 26 after forming an etch stop layer according to one or more embodiments.

After forming the openings 425, as shown in FIG. 27, an etch stop layer 410 is formed on the exposed sacrificial surfaces 203 of the sacrificial layers 202 and the inner end 422 of the recessed replacement channel layers 420. A portion 432 of the etch stop layer 410 is on the surface 203 of the sacrificial layer 202, and an end wall 411 of the etch stop layer 410 is formed on the inner end 422 of the recessed replacement channel layers 420. The opening 425 remains and is bounded by the etch stop layer 410. The size of the opening 425 of some embodiments, increases, decreases or remains the same after forming the etch stop layer 410. The etch stop layer 410 can be any suitable material formed by any suitable process known to the skilled artisan. The etch stop layer 410 of some embodiments is a material that is etch selective relative to the sacrificial layers 202 and the replacement channel layers 420. In some embodiments, the etch stop layer 410 is a conformal film deposited by atomic layer deposition.

In some embodiments, the opening 425 is widened by any suitable technique known to the skilled artisan before depositing the etch stop layer 410. The size of the opening 425 can be tuned to provide an active region 115 with predetermined dimensions.

Figure 28:
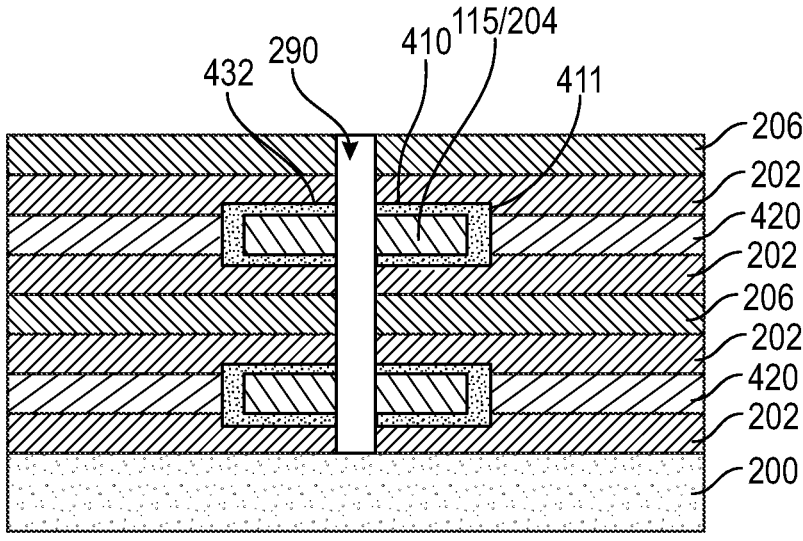
FIG. 28 illustrates an expanded cross-sectional view of the memory device of FIG. 27 after forming an active region according to one or more embodiments.

FIG. 28 shows the electronic device of FIG. 27 after depositing an active region 115 within the opening 425 within the etch stop layer 410. The active region 115 forms a pair of channel layers 204 on opposite sides of the trench 290 along the first direction 20 (X-axis).

Figure 29:
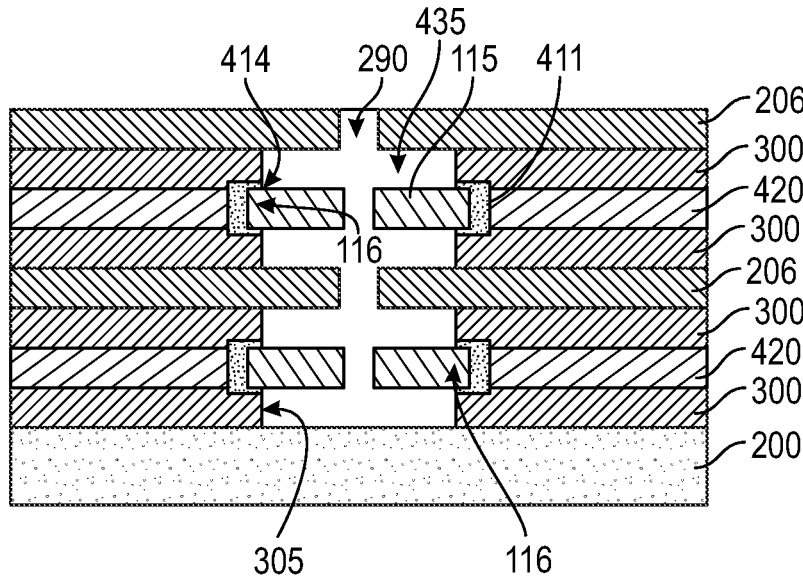
FIG. 29 illustrates an expanded cross-sectional view of the memory device of FIG. 28 after recessing the dielectric and etch stop layer according to one or more embodiments.

FIG. 29 shows the electronic device of FIG. 28 after removing a portion of the sacrificial layer 202 to form a recessed sacrificial layer 300, similar to that shown in FIG. 10B.

In some embodiments, the sacrificial layer 202 is recessed to a depth less than the depth that the replacement channel layers 420 were recessed to prior to forming the etch stop layer 410. In some embodiments, the sacrificial layer 202 is recessed to a depth less than the depth sufficient so that the end wall 411 portion of the etch stop layer 410 on the inner end 422 of the recessed replacement channel layer 420 is not exposed. In some embodiments, the surface 305 of the recessed sacrificial layer 300 is in the range of 5 nm to 20 nm closer to the trench 290 than the end wall 411 of the etch stop layer 410, along the first direction 20 (X-axis). In some embodiments, the surface 305 of the recessed sacrificial layer 300 is in the range of 5 nm to 20 nm closer to the trench 290 than the outer end 116 of the active region 115, along the first direction 20 (X-axis).

In some embodiments, as shown in FIG. 29, a portion 432 of the etch stop layer 410 on the surface 203 of the sacrificial layer 202 is removed. In some embodiments, the portion 432 of the etch stop layer 410 is removed at the same time as recessing the sacrificial layer 202 to form the recessed sacrificial layer 300. In some embodiments, removing the portion 432 of the etch stop layer 410 is done separately from recessing the sacrificial layer 202 so that the recessed sacrificial layer 300 is formed followed by removal of the portion 432 of the etch stop layer 410.

Figure 30:
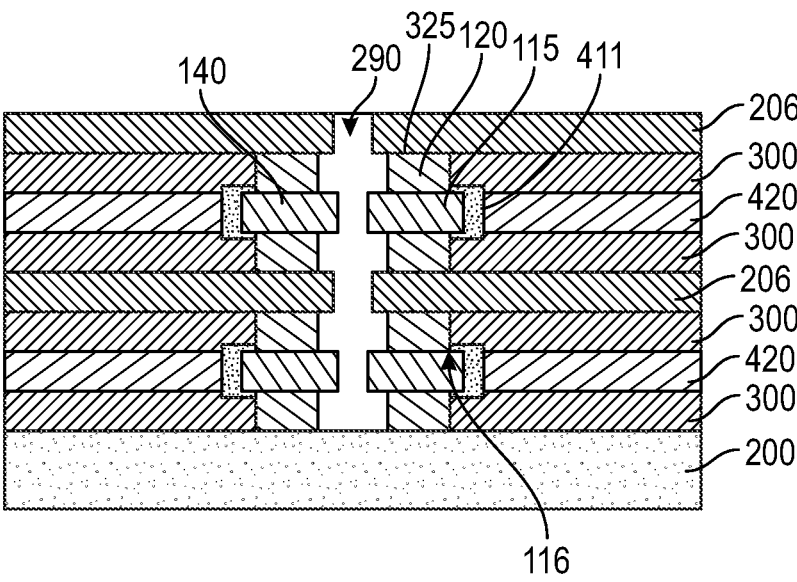
FIG. 30 illustrates an expanded cross-sectional view of the memory device of FIG. 29 after forming word lines according to one or more embodiments.

FIG. 30 shows the electronic device of FIG. 29 after forming the gate oxide layer 140 on the active region 115, forming the optional liner 325 in the opening 435 formed with the recessed sacrificial layer 300, and forming the conductive layer 120 within the optional liner 325.

Figure 31:
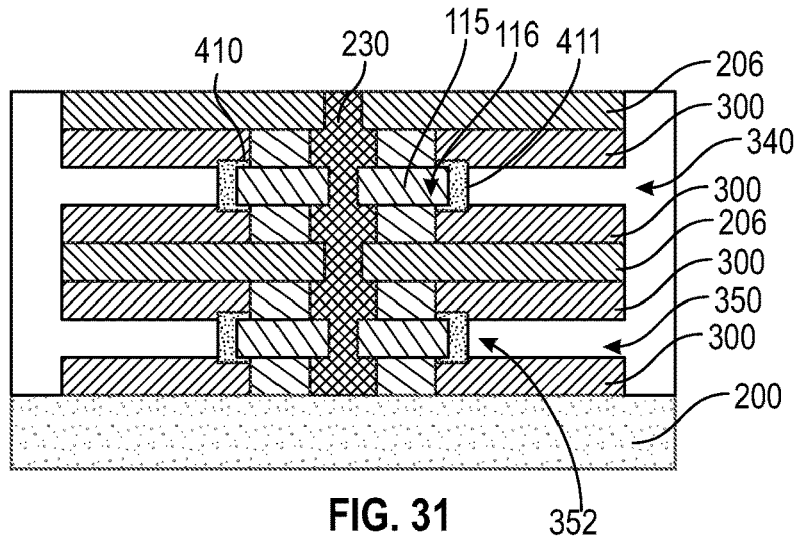
FIG. 31 illustrates an expanded cross-sectional view of the memory device of FIG. 30 after filling the trench, slit patterning and replacement gate etching to form a capacitor opening according to one or more embodiments.

FIG. 31 shows the electronic device of FIG. 30 after filling trench 290 with dielectric 230, forming a slit pattern 340 and removing the replacement channel layers 420 through the slit pattern 340, in one or more processes similar to that described with respect to FIGS. 13-16. After removing the replacement channel layers 420, capacitor opening 350 is formed. The inner end 352 of the capacitor opening 350 (end furthest from the slit pattern) is bounded by the end wall 411 of the etch stop layer 410.

Figure 32:
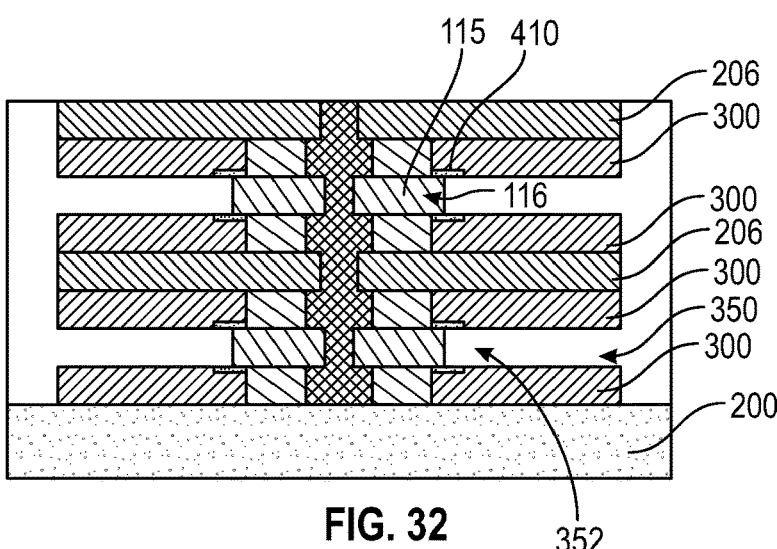
FIG. 32 illustrates an expanded cross-sectional view of the memory device of FIG. 31 after removing the etch stop layer according to one or more embodiments.

FIG. 32 shows the electronic device of FIG. 31 after removing the end wall 411 of the etch stop layer 410 from the inner end 352 of the capacitor opening 350. Removing the etch stop layer 410 exposes the outer end 116 of the active region 115. In some embodiments, portions of the etch stop layer 410 remain above and below (relative to the third direction 40) the inner end 352 of the capacitor opening 350. In some embodiments, portions of the etch stop layer 410 straddle the interface between the outer end 116 of the active region 115 and the capacitor opening 350.

Figure 33:
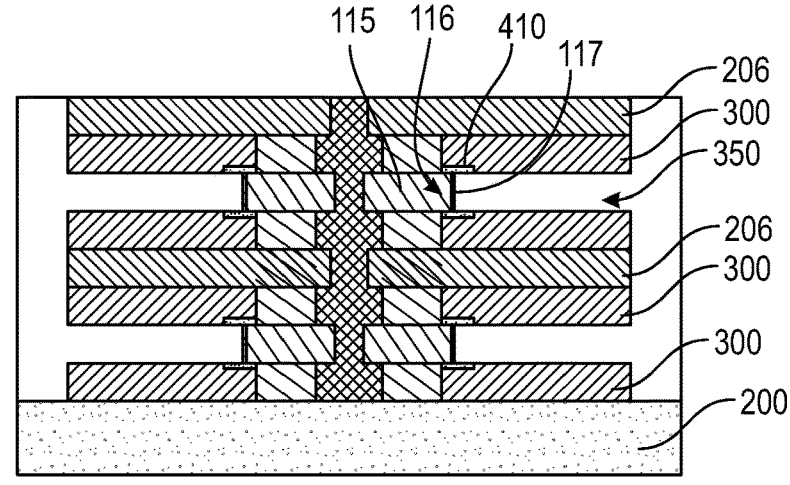
FIG. 33 illustrates an expanded cross-sectional view of the memory device of FIG. 32 after doping the active region prior to forming the capacitor according to one or more embodiments.

FIG. 33 shows the electronic device of FIG. 32 after doping the outer end 116 of the active region 115 through capacitor opening 350 to form the doped layer 117. The process of some embodiments proceeds as illustrated and described with respect to FIGS. 16 through 23, with the etch stop layer 410 remaining in the final device, as shown in FIG. 24. In some embodiments, the capacitor opening 350 is widened similarly to that discussed with respect to FIGS. 19 and 20.

Figure 34:
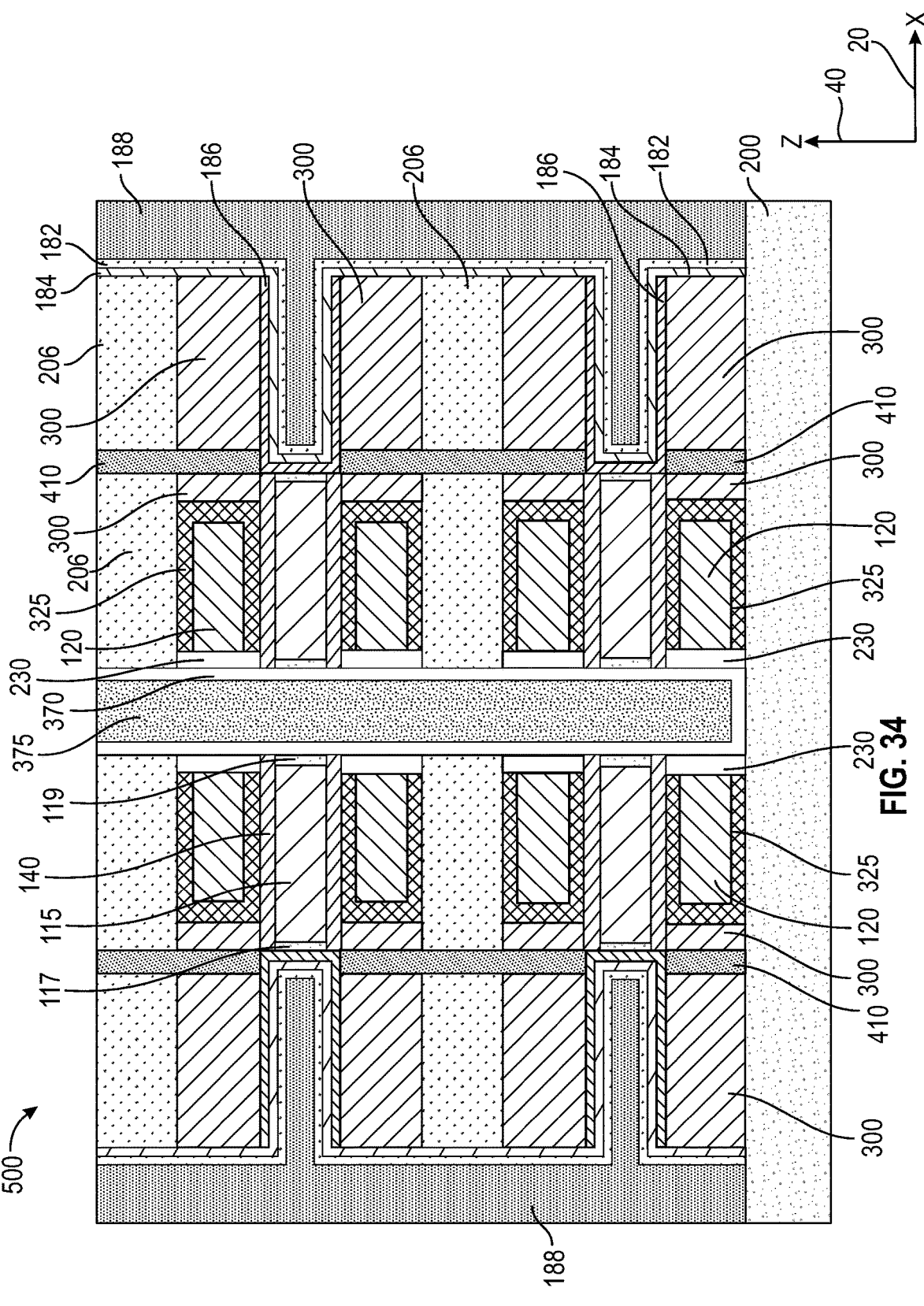
FIG. 34 illustrates a schematic view of a memory device according to one or more embodiment of the disclosure.

FIG. 34 shows an electronic device 500 according to one or more embodiment of the disclosure. The device 500 is similar to the device of FIG. 3 with the addition of an etch stop layer 410 form along the third direction 40 (Z-axis). The etch stop layer 410 extends through the device 500 at a position equivalent to the inner end 352 of the capacitor opening 350. The etch stop layer 410 of some embodiments comprises a dielectric material to prevent electrical shorting. The etch stop layer 410 passes through the insulator layers 206 and recessed sacrificial layer 300. In some embodiments, the etch stop layer 410 interrupts the continuity of the insulator layers 206 and recessed sacrificial layer 300 along the first direction 20 (X-axis).

Some embodiments of the disclosure are directed to methods of forming the electronic device 500. FIGS. 35-39 provide cross-sectional views illustrating a method according to one or more embodiment. The process of forming the device 500 is similar to that illustrated in FIGS. 5-23 and several points along the process are illustrated to point out the differences.

FIG. 35 shows a stack of films similar to that of FIG. 5 with an etch stop layer (ESL) opening 405 formed through the stack along the third direction 40 (Z-axis). The ESL opening 405 is filled with an etch stop layer 410. The etch stop layer 410 can be any suitable material deposited by any suitable technique known to the skilled artisan. In some embodiments, as shown in the Figures, the ESL opening 405 is formed on opposite sides, in the first direction 20 (X-axis), of the point where the trench 290 will be formed.

FIG. 36 shows the electronic device of FIG. 35 after processes analogous to those of FIGS. 9, 9A-9D, 10 and 10A-10D. The trench 290 of some embodiments is formed about midway between two ESL openings 405, along the first direction 20 (X-axis).

The sacrificial layer 202 is etched to form the recessed sacrificial layer 300. In some embodiments, the etch process moves the surface 305 of the recessed sacrificial layer 300 away from the trench 290 by a distance less than the distance from the trench 290 to the ESL opening 405. In some embodiments, the etch process moves the surface 305 to the etch stop layer 410.

Figure 11:
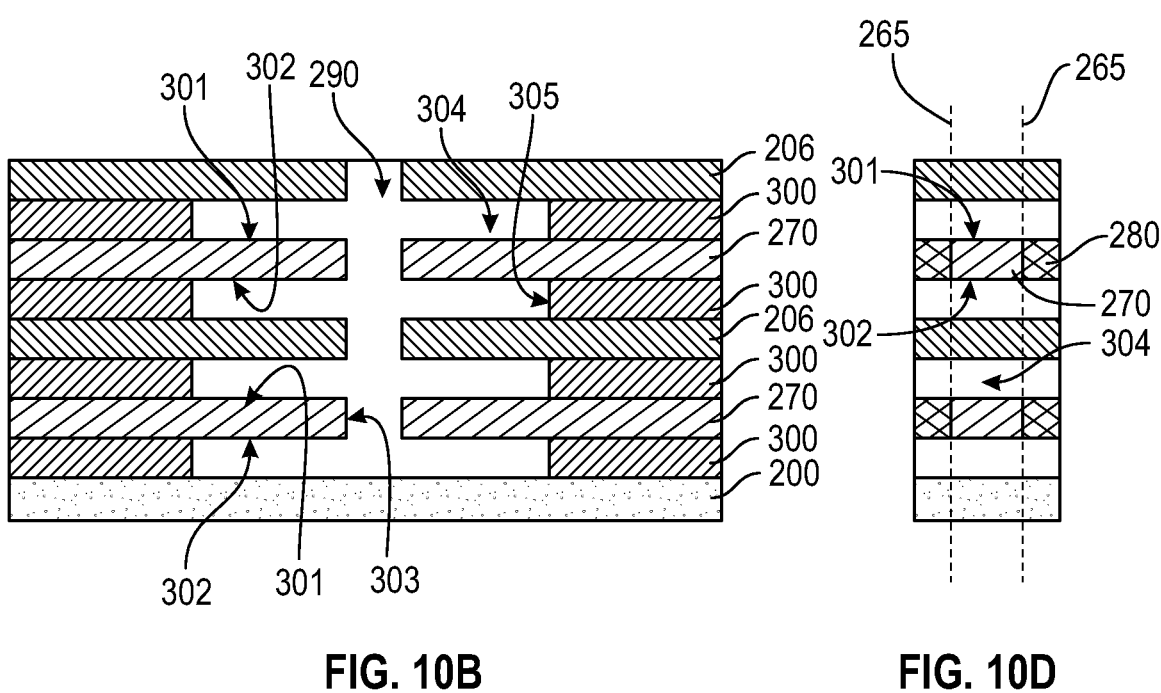
FIG. 11 illustrate a schematic top view of a memory device after gate oxide formation according to one or more embodiments.
Figure 11:
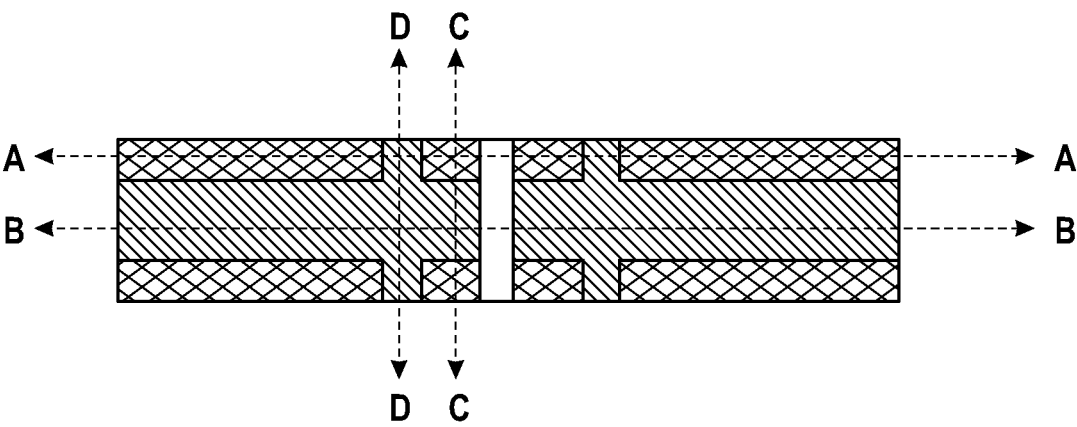
Figures 11A, 11C:
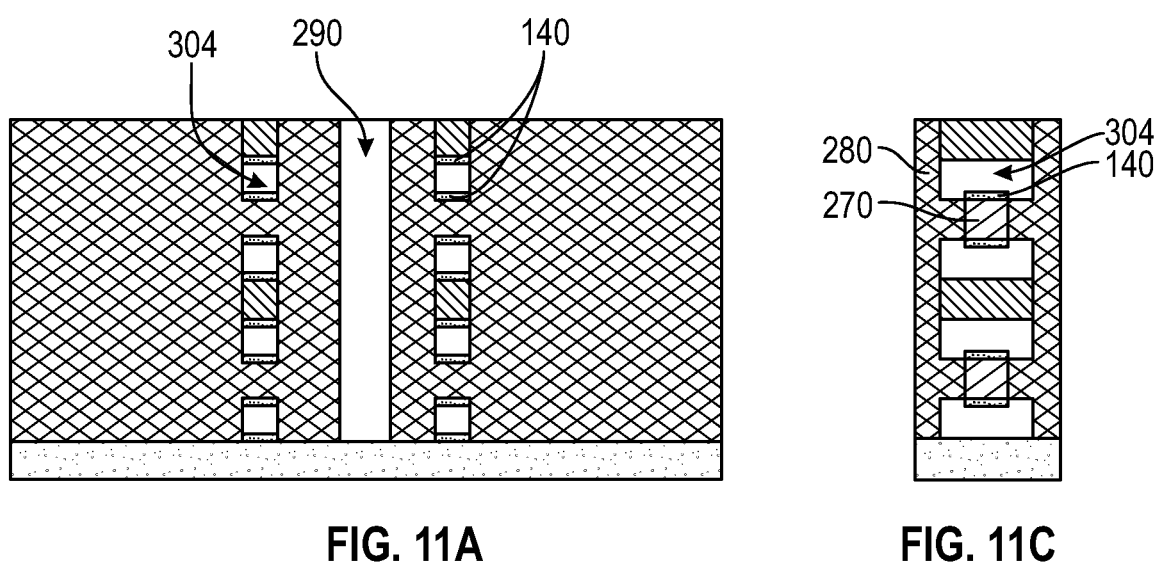
FIG. 11A illustrates a cross-sectional slice of a memory device taken along line A-A of FIG. 11.
FIG. 11C illustrates a cross-sectional slice of a memory device taken along line C-C of FIG. 11.
Figures 11B, 11D:
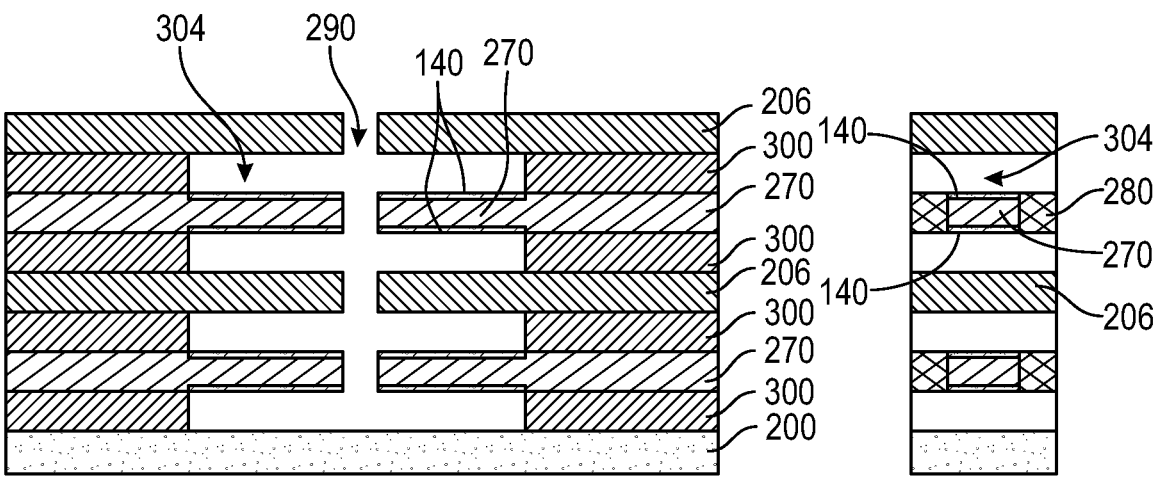
FIG. 11B illustrates a cross-sectional slice of a memory device taken along line B-B of FIG. 11.
FIG. 11D illustrates a cross-sectional slice of the memory device taken along line D-D of FIG. 11.

FIG. 37 shows the electronic device of FIG. 36 after processes analogous to those of FIGS. 11-13 (including the A-D subfigures). The conductive layer 120, optional liner 325, gate oxide layer 140 and dielectric 230 are formed. The illustrated embodiment also includes formation of the source/drain region 119 on the inner end of the active region 115.

Figure 38:
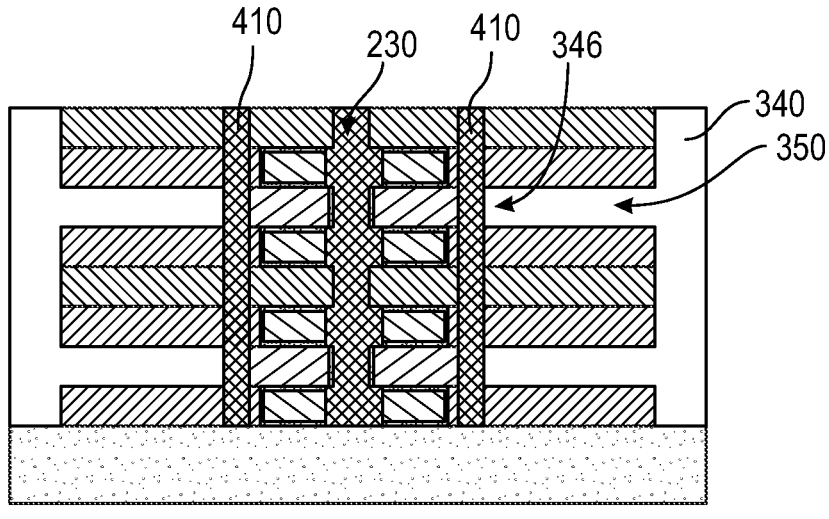
FIG. 38 illustrates a cross-sectional view of the memory device of FIG. 37 after replacement gate etching to the etch stop layer according to one or more embodiments.

FIG. 38 shows the electronic device of FIG. 37 after processes analogous to those of FIGS. 14-16 (including the A-D subfigures). Slit patterning 340 and etching processes create the capacitor opening 350. The sidewall 346 of the recessed channel layer, which is the inner wall of the capacitor opening 350, is moved to the etch stop layer 410 in the ESL opening 405.

Figure 39:
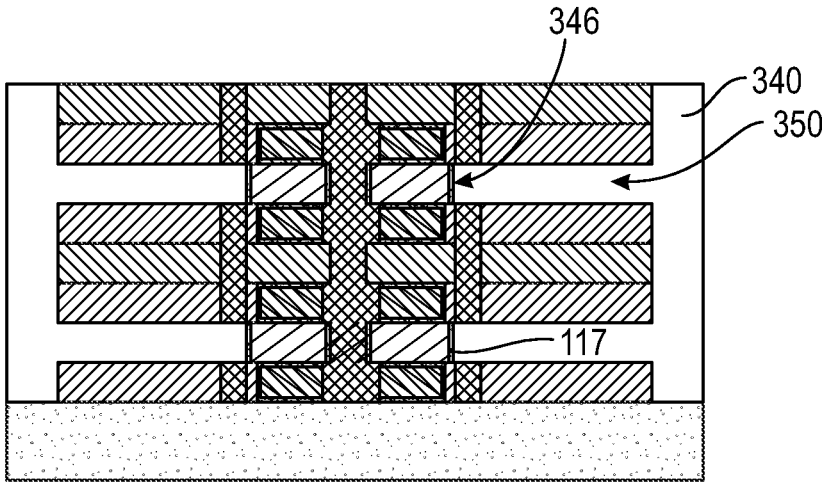
FIG. 39 illustrates a cross-sectional view of the memory device of FIG. 38 after removing the etch stop layer and doping the active region prior to capacitor formation according to one or more embodiments.

FIG. 39 shows the electronic device of FIG. 38 after removing the etch stop layer 410 through the capacitor opening 350. The outer end 116 of the active region 115 is optionally doped to form the doped layer 117. The process flow of some embodiments concludes with formation of the capacitor following analogous processes to those described in FIGS. 17-20, and bit line metal 375 following analogous processes to those described in FIGS. 21-23.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner. Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A memory device comprising:
a plurality of active regions separated and spaced along a first direction, a second direction, and a third direction;
a plurality of conductive layers arranged so that at least one conductive layer is adjacent to at least one side of each of the active regions along the third direction;
a conductive bridge extending along the second direction and connecting each conductive layer to one or more adjacent conductive layers, the conductive bridge having a length along the first direction that is smaller than the length of each of the plurality of conductive layers along the first direction;
a gate oxide layer between the plurality of active regions and the at least one conductive layer;

a capacitor on a first side of the plurality of active regions along the first direction, the capacitor not in direct contact with the plurality of conductive layers or with the conductive bridge, the capacitor including a first electrode in contact with a doped layer, a high-k dielectric disposed inside the first electrode and a second electrode disposed inside the high-k dielectric, the first electrode extending in the first direction so as to cover the high-k dielectric, the high-k dielectric extending in the first direction so as to cover the second electrode, and the second electrode extending in the first direction so as to cover a dielectric;
the doped layer between the capacitor and the plurality of active regions in the first direction; and
a source/drain region on a second side of the plurality of active regions along the first direction, the second side opposite the first side.

2. The memory device of claim 1, wherein the plurality of active regions comprise a transistor.

3. The memory device of claim 1, further comprising a bit line extending along the third direction adjacent the active regions spaced along the third direction.

4. The memory device of claim 1, wherein each of the plurality of active regions comprises a transistor and a gate is between the transistor and the conductive layers along the third direction, wherein each active region is in connection with a single gate.

5. A memory device comprising:
a plurality of pairs of active regions, the pairs spaced along a first direction, a second direction and a third direction;
a plurality of bit lines extending along the third direction between pairs of active regions spaced in the first direction;
a plurality of conductive layers arranged so that at least one conductive layer is adjacent to at least one side of each of the active regions, the at least one side being located along the third direction relative to the plurality of pairs of active regions;
a conductive bridge extending along the second direction connecting each conductive layer to one or more adjacent conductive layers, the conductive bridge having a bridge length along the first direction that is smaller than a conductive layer length of each of the plurality of conductive layers along the first direction;
a gate oxide layer between the plurality of pairs of active regions and the plurality of conductive layers in the third direction;
a capacitor on one side of the plurality of pairs of active regions opposite the plurality of bit lines in the first direction, the capacitor including a first electrode in contact with a doped layer, a high-k dielectric disposed inside the first electrode and a second electrode disposed inside the high-k dielectric, the first electrode extending in the first direction so as to cover the high-k dielectric, the high-k dielectric extending in the first direction so as to cover the second electrode, and the second electrode extending in the first direction so as to cover a dielectric;
the doped layer between the capacitor and the plurality of pairs of active regions in the first direction; and
a source/drain region on another side of the plurality of pairs of active regions adjacent to the plurality of bit lines in the first direction are provided with each of the active regions.

6. The memory device of claim 5, wherein the plurality of pairs of active regions comprises a transistor and a gate is between the transistor and the conductive layers along the third direction.

7. The memory device of claim 6, wherein the conductive layer length along the first direction is in the range of 50 nm to 300 nm, and the bridge length along the first direction is in the range of 5 nm to 180 nm.

8. The memory device of claim 6, wherein each of the plurality of pairs of active regions is in connection with a single gate.

\* \* \* \* \*